United States Patent
Lee et al.

(10) Patent No.: US 12,437,998 B2
(45) Date of Patent: Oct. 7, 2025

(54) METHOD OF MANUFACTURING INTEGRATED CIRCUIT DEVICE

(71) Applicant: SAMSUNG ELECTRONICS CO., LTD., Suwon-si (KR)

(72) Inventors: Yeojin Lee, Suwon-si (KR); Hyunjae Kang, Suwon-si (KR); Sangjin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 404 days.

(21) Appl. No.: 18/143,296

(22) Filed: May 4, 2023

(65) Prior Publication Data
US 2024/0047211 A1 Feb. 8, 2024

(30) Foreign Application Priority Data
Aug. 3, 2022 (KR) .................... 10-2022-0096754

(51) Int. Cl.
*H01L 21/033* (2006.01)
*H01L 21/027* (2006.01)
(Continued)

(52) U.S. Cl.
CPC ...... *H01L 21/0337* (2013.01); *H01L 21/0276* (2013.01); *H10D 64/017* (2025.01); *H10D 84/0158* (2025.01); *H10D 84/038* (2025.01)

(58) Field of Classification Search
CPC ............ H01L 21/0276; H01L 21/0332; H01L 21/0337; H01L 21/32139; H10D 30/0273;
(Continued)

(56) References Cited

U.S. PATENT DOCUMENTS 6,903,428 B2   6/2005 Lee
8,288,263 B2  10/2012 Kim et al.
(Continued)

FOREIGN PATENT DOCUMENTS

JP    5972058 B2    8/2016
KR   10-0165411 B1  3/1999
(Continued)

*Primary Examiner* — Cheung Lee
(74) *Attorney, Agent, or Firm* — Sughrue Mion, PLLC

(57) ABSTRACT

In some embodiments, a method of manufacturing an integrated circuit device includes forming a feature structure on a substrate, forming a first hardmask configured to cover the feature structure, forming, on the first hardmask, a second hardmask comprising a plurality of first line portions extending lengthwise in a first horizontal direction and being apart from each other in a second horizontal direction perpendicular to the first horizontal direction, forming, on at least one of the first hardmask and the second hardmask, an etch mask pattern comprising a plurality of second line portions, forming, from the first hardmask, a first hardmask pattern comprising a plurality of third line portions, forming, from the second hardmask, a plurality of second hardmask patterns, and forming a feature pattern comprising a plurality of fourth line portions by etching the feature structure and using the plurality of second hardmask patterns and the first hardmask pattern.

20 Claims, 44 Drawing Sheets

(51) Int. Cl.
*H10D 64/01* (2025.01)
*H10D 84/01* (2025.01)
*H10D 84/03* (2025.01)

(58) Field of Classification Search
CPC ......... H10D 30/501–509; H10D 30/62; H10D 64/017; H10D 84/01; H10D 84/0135; H10D 84/0151; H10D 84/0158; H10D 84/02; H10D 84/032; H10D 84/035; H10D 84/038; H10D 84/05; H10D 84/07; H10D 84/08; H10D 84/8311; H10D 84/8312; H10D 84/83125; H10D 84/83135; H10D 84/83138; H10D 84/8314; H10D 84/8316; H10D 84/832–833; H10D 84/834; H10D 84/835; H10D 84/836; H10D 84/837–839
See application file for complete search history.

(56) References Cited

U.S. PATENT DOCUMENTS

| | | | |
|---|---|---|---|
| 8,343,861 | B2 | 1/2013 | Mabuchi |
| 10,438,799 | B2 | 10/2019 | Park et al. |
| 11,264,482 | B2 | 3/2022 | Kim et al. |
| 2022/0270878 | A1* | 8/2022 | Kim .................. H01L 21/31144 |

FOREIGN PATENT DOCUMENTS

| | | |
|---|---|---|
| KR | 10-0484261 B1 | 4/2005 |
| KR | 10-2006-0062536 A | 6/2006 |
| KR | 10-2006-0103651 A | 10/2006 |
| KR | 10-0744659 B1 | 8/2007 |
| KR | 10-2007-0109485 A | 11/2007 |
| KR | 10-2008-0069428 A | 7/2008 |
| KR | 10-1096186 B1 | 12/2011 |

* cited by examiner

X2 - X2'

X2 – X2'

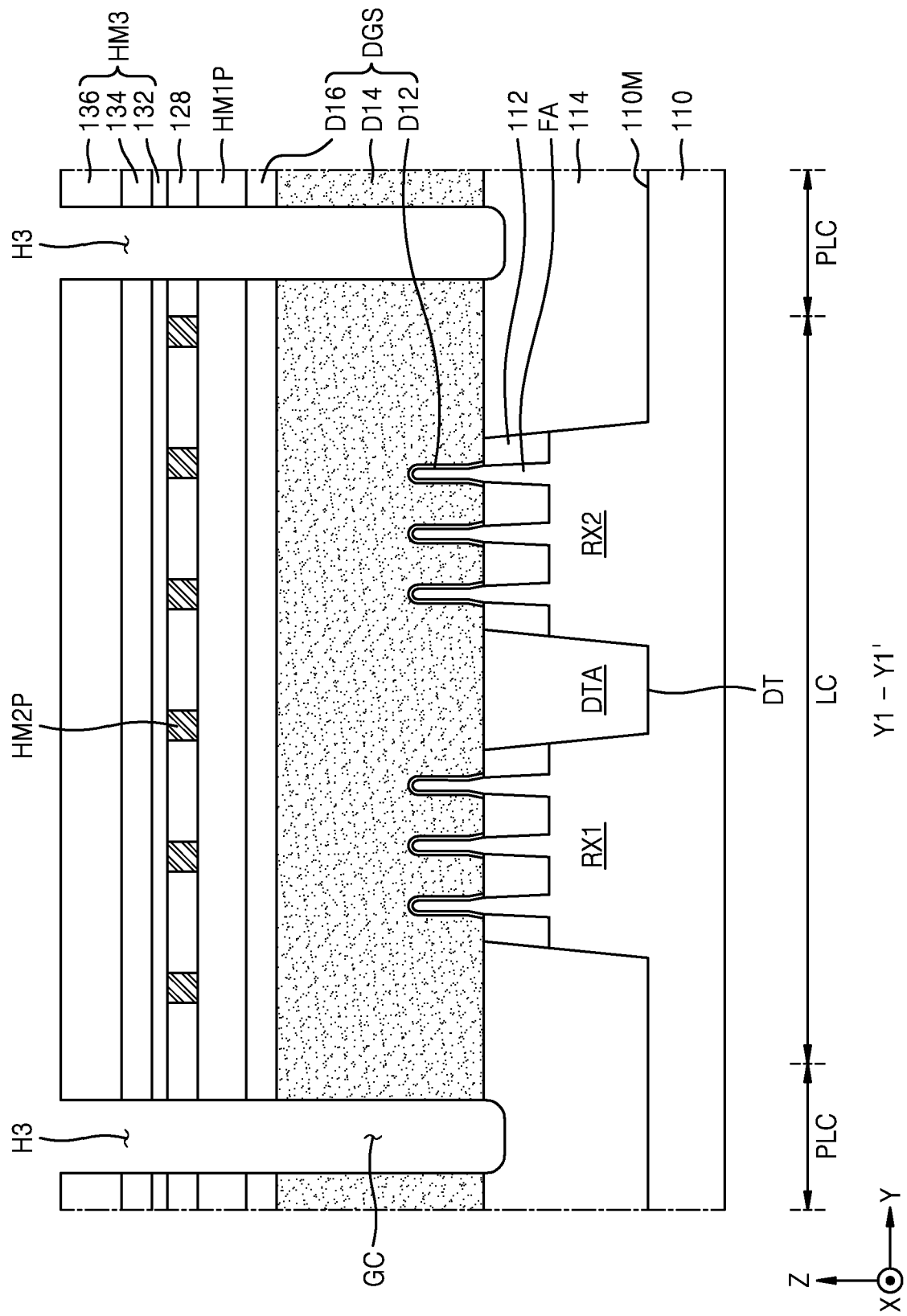

X2 – X2'

METHOD OF MANUFACTURING INTEGRATED CIRCUIT DEVICE

CROSS-REFERENCE TO RELATED APPLICATION

This application claims benefit of priority under 35 U.S.C. § 119 to Korean Patent Application No. 10-2022-0096754, filed on Aug. 3, 2022, in the Korean Intellectual Property Office, the disclosure of which is incorporated by reference herein in its entirety.

BACKGROUND

1. Field

The present disclosure relates generally to a method of manufacturing an integrated circuit device, and more particularly, to a method of manufacturing an integrated circuit device, the method including a process of forming a line pattern.

2. Description of Related Art

Due to the development of electronics technology, semiconductor devices have been rapidly down-scaled. Accordingly, when relatively long and narrow line patterns are formed in device regions having relatively small areas, process defects, such as the unintended leaning or collapse of the line patterns, may be generated. Therefore, it may be required to develop a technique for optimizing the performance of integrated circuit devices and improving the reliability thereof, by stably forming long and narrow line patterns.

SUMMARY

The present disclosure provides a method of manufacturing an integrated circuit device, the method allowing the integrated circuit device having optimized performance and improved reliability to be manufactured by stably forming long and narrow line patterns during a process of manufacturing the integrated circuit device having a device region that is reduced in area due to down-scaling.

According to an aspect of the present disclosure, a method of manufacturing an integrated circuit device is provided. The method includes forming a feature structure on a substrate. The method further includes forming a first hardmask configured to cover the feature structure. The method further includes forming, on the first hardmask, a second hardmask including a plurality of first line portions. The plurality of first line portions extends lengthwise in a first horizontal direction. Each first line portion of the plurality of first line portions is apart from remaining first line portions of the plurality of first line portions in a second horizontal direction. The second horizontal direction is perpendicular to the first horizontal direction. The method further includes forming, on at least one of the first hardmask and the second hardmask, an etch mask pattern that includes a plurality of second line portions. The plurality of second line portions extends lengthwise in the second horizontal direction. Each second line portion of the plurality of second line portions is apart from remaining second line portions of the plurality of second line portions in the first horizontal direction. The method further includes forming a first hardmask pattern from the first hardmask by etching the first hardmask and using the etch mask pattern as a first etch mask. The first hardmask pattern includes a plurality of third line portions. Each third line portion of the plurality of third line portions is parallel to remaining third line portions of the plurality of third line portions. The method further includes forming a plurality of second hardmask patterns from the second hardmask by etching the second hardmask and using the etch mask pattern as a second etch mask. The method further includes forming a feature pattern by etching the feature structure and using the plurality of second hardmask patterns and the first hardmask pattern as a feature etch mask. The feature pattern includes a plurality of fourth line portions. The plurality of fourth line portions extends lengthwise in the second horizontal direction. Each fourth line portion of the plurality of fourth line portions is apart from remaining fourth line portions of the plurality of fourth line portions in the first horizontal direction.

According to an aspect of the present disclosure, another method of manufacturing an integrated circuit device is provided. The method includes forming a plurality of fin-type active regions in a substrate. The method further includes forming a plurality of dummy gate structures on the plurality of fin-type active regions. The method further includes forming a cut space in at least one dummy gate structure selected from the plurality of dummy gate structures by partially etching the at least one dummy gate structure. The method further includes forming an isolation insulating film configured to fill the cut space. The forming of the plurality of dummy gate structures includes forming a feature structure on the substrate in which the plurality of fin-type active regions are formed. The forming of the plurality of dummy gate structures further includes forming a first hardmask configured to cover the feature structure. The forming of the plurality of dummy gate structures further includes forming, on the first hardmask, a second hardmask including a plurality of first line portions. The plurality of first line portions extends lengthwise in a first horizontal direction. Each first line portion of the plurality of first line portions is apart from remaining first line portions of the plurality of first line portions in a second horizontal direction. The second horizontal direction is perpendicular to the first horizontal direction. The forming of the plurality of dummy gate structures further includes forming, on at least one of the first hardmask and the second hardmask, an etch mask pattern including a plurality of second line portions. The plurality of second line portions extends lengthwise in the second horizontal direction. Each second line portion of the plurality of second line portions is apart from remaining second line portions of the plurality of second line portions in the first horizontal direction. The forming of the plurality of dummy gate structures further includes forming a first hardmask pattern from the first hardmask by etching the first hardmask and using the etch mask pattern as a first etch mask. The first hardmask pattern includes a plurality of third line portions. Each third line portion of the plurality of third line portions is parallel to remaining third line portions of the plurality of third line portions. The forming of the plurality of dummy gate structures further includes forming a plurality of second hardmask patterns from the second hardmask by etching the second hardmask and using the etch mask pattern as a second etch mask. The forming of the plurality of dummy gate structures includes forming the plurality of dummy gate structures to respectively include a plurality of fourth line portions by etching the feature structure by using the plurality of second hardmask patterns and the first hardmask pattern as a feature etch mask. The plurality of fourth line portions extends lengthwise in the second horizontal direction. Each fourth line portion of the plurality of fourth line portions is apart from remaining fourth line portions of the plurality of fourth line portions in the first horizontal direction.

According to an aspect of the present disclosure, another method of manufacturing an integrated circuit device is provided. The method includes forming a plurality of fin-type active regions in a substrate to extend lengthwise in a first horizontal direction. The method further includes forming a plurality of dummy gate structures on the plurality of fin-type active regions to extend lengthwise in a second horizontal direction. The second horizontal direction is perpendicular to the first horizontal direction. The method further includes filling each space between the plurality of dummy gate structures with an insulating structure. The method further includes forming, on the plurality of dummy gate structures and a plurality of insulating structures, a hardmask pattern having an opening that exposes at least one dummy gate structure selected from the plurality of dummy gate structures and a portion of the plurality of insulating structures. The method further includes forming a cut space in the at least one dummy gate structure by selectively etching the at least one dummy gate structure from among the at least one dummy gate structure and the insulating structure. The method further includes forming an isolation insulating film configured to fill the cut space. The forming of the plurality of dummy gate structures includes forming a feature structure on the substrate in which the plurality of fin-type active regions are formed. The forming of the plurality of dummy gate structures further includes forming a first hardmask configured to cover the feature structure. The forming of the plurality of dummy gate structures further includes forming, on the first hardmask, a second hardmask including a plurality of first line portions. The plurality of first line portions extends lengthwise in the first horizontal direction. The forming of the plurality of dummy gate structures further includes forming, on the first hardmask and the second hardmask, an etch mask pattern including a plurality of second line portions. The plurality of second line portions extends lengthwise in the second horizontal direction. The forming of the plurality of dummy gate structures further includes forming a first hardmask pattern including a line pattern from the first hardmask by etching the first hardmask and using the etch mask pattern as a first etch mask. The forming of the plurality of dummy gate structures further includes forming a plurality of second hardmask patterns, respectively including a plurality of island patterns from the second hardmask, by etching the second hardmask and using the etch mask pattern as a second etch mask. The forming of the plurality of dummy gate structures further includes etching the feature structure by using the plurality of second hardmask patterns and the first hardmask pattern as a feature etch mask.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 1A to 9D are diagrams illustrating a method of manufacturing an integrated circuit device, according to some embodiments, and in particular, FIGS. 1A, 2A, 3A, 4A, 5A, 6A, 7A, 8A, and 9A are plan views respectively illustrating a sequence of processes of the method of manufacturing an integrated circuit device, FIGS. 1B, 2B, 3B, 4B, 5B, 6B, 7B, 8B, and 9B are cross-sectional views taken along lines Y1-Y1' of FIGS. 1A, 2A, 3A, 4A, 5A, 6A, 7A, 8A, and 9A, respectively, FIGS. 1D, 2D, 3D, 4D, 5D, 6D, 7D, 8D, and 9D are cross-sectional views taken along lines X2-X2' of FIGS. 1A, 2A, 3A, 4A, 5A, 6A, 7A, 8A, and 9A, respectively;

DETAILED DESCRIPTION

Figure 1A:
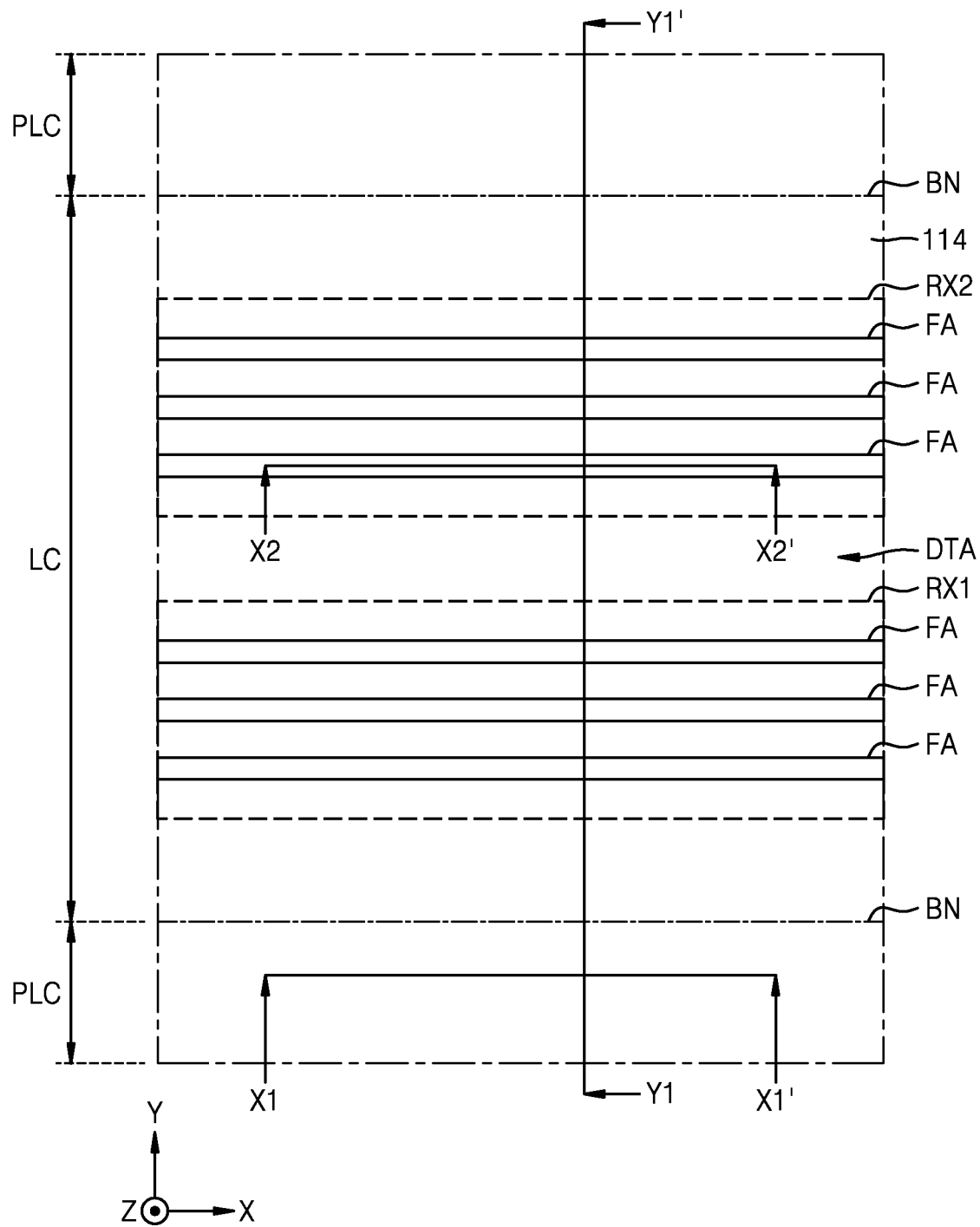
Figure 1B:
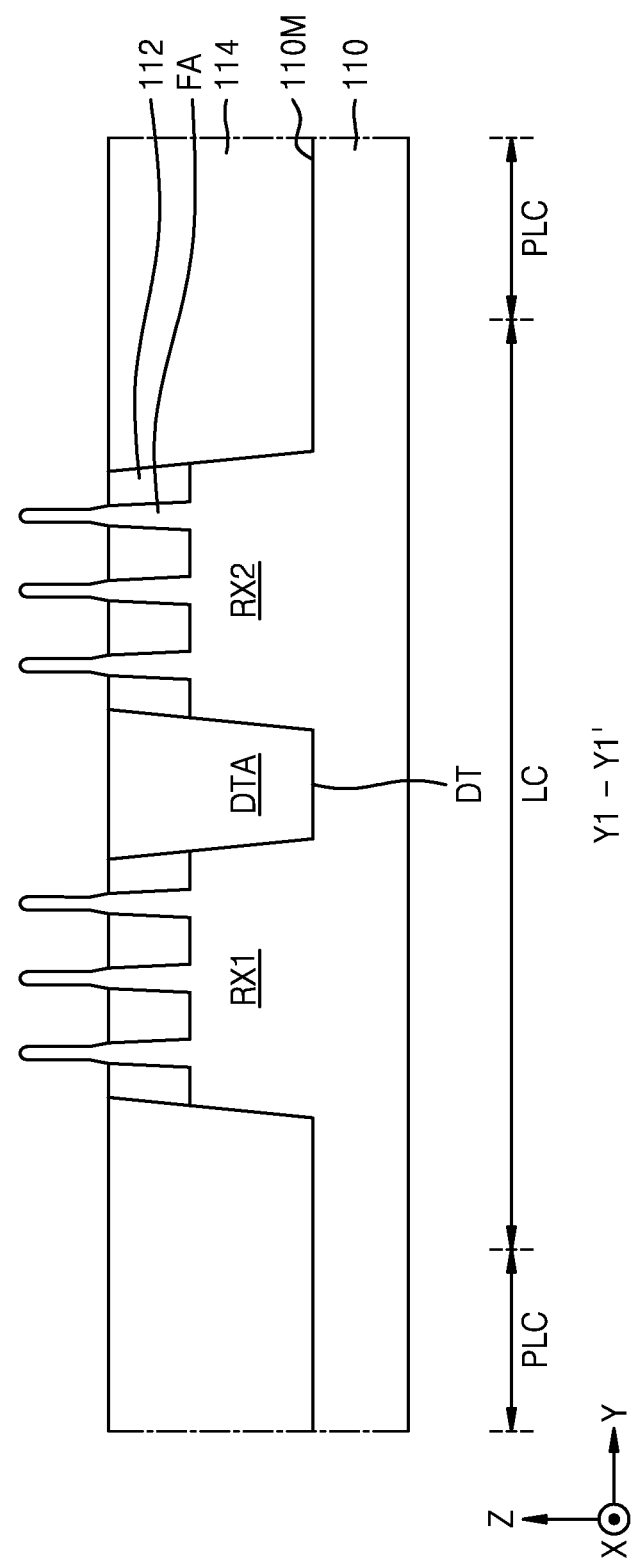
Figure 1C:
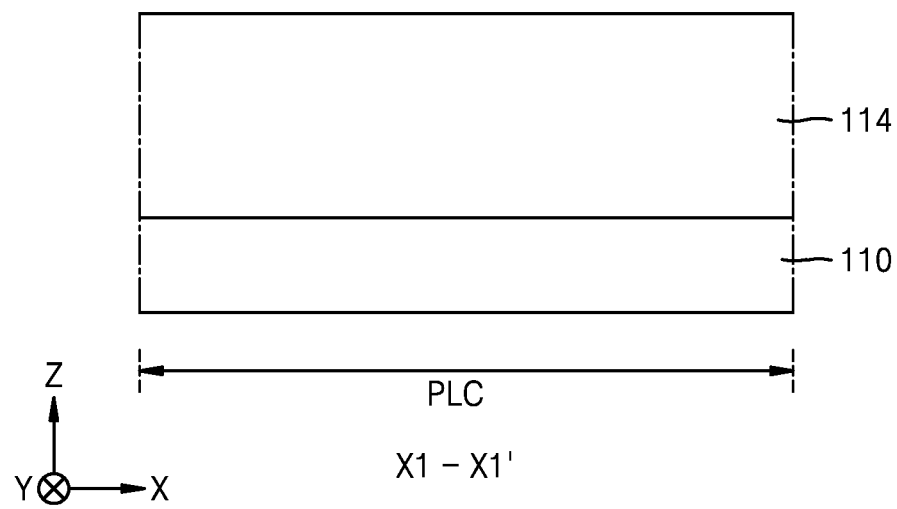
FIGS. 1C, 2C, 3C, 4C, 5C, 6C, 7C, 8C, and 9C are cross-sectional views taken along lines X1-X1' of FIGS. 1A, 2A, 3A, 4A, 5A, 6A, 7A, 8A, and 9A, respectively.
Figure 1D:
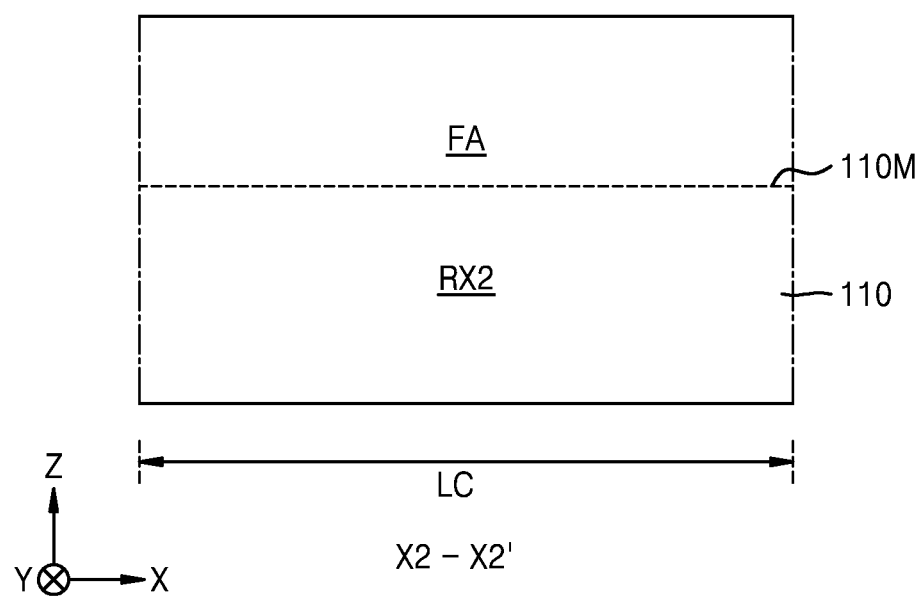
Figure 2A:
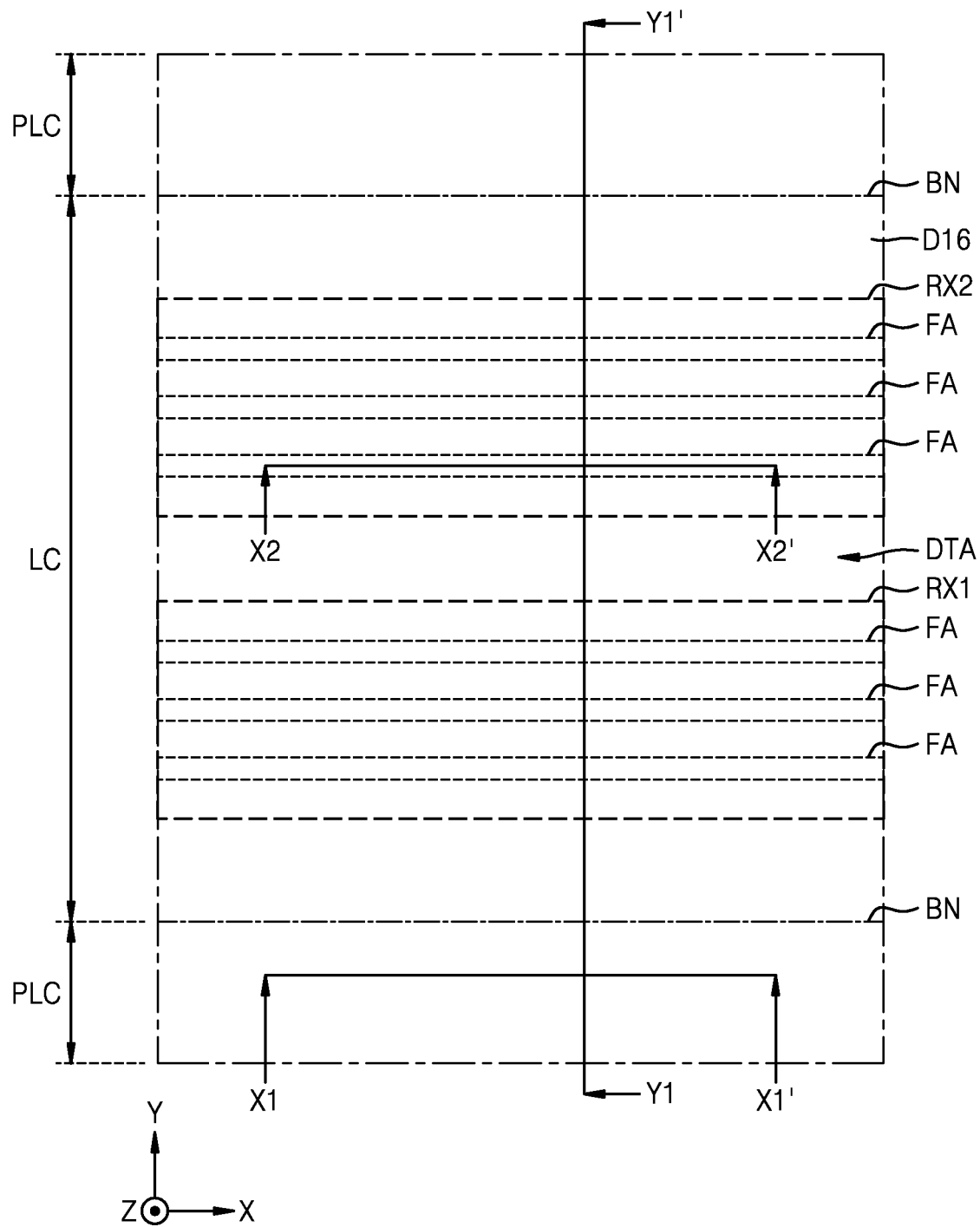
Figure 2B:
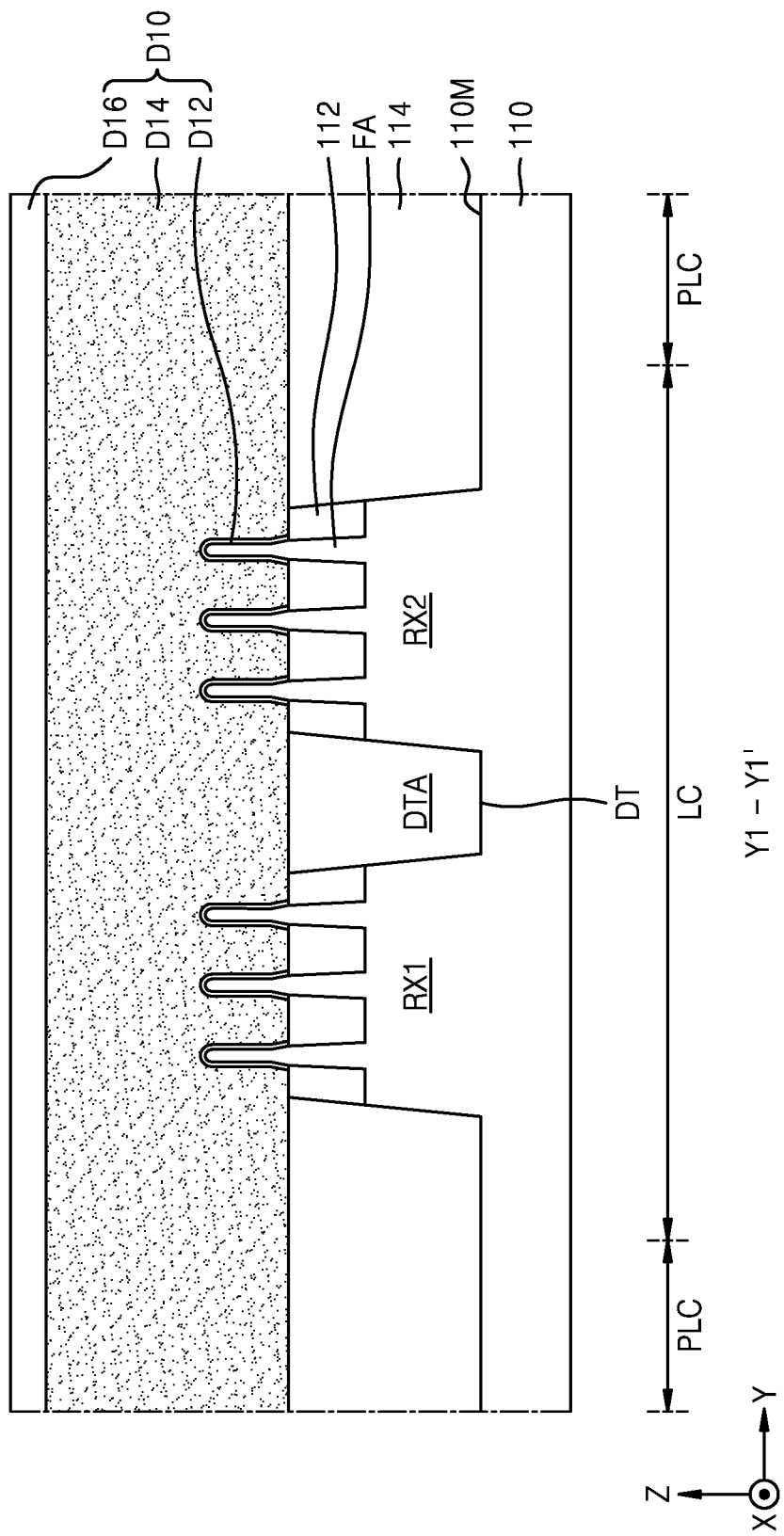
Figure 2C:
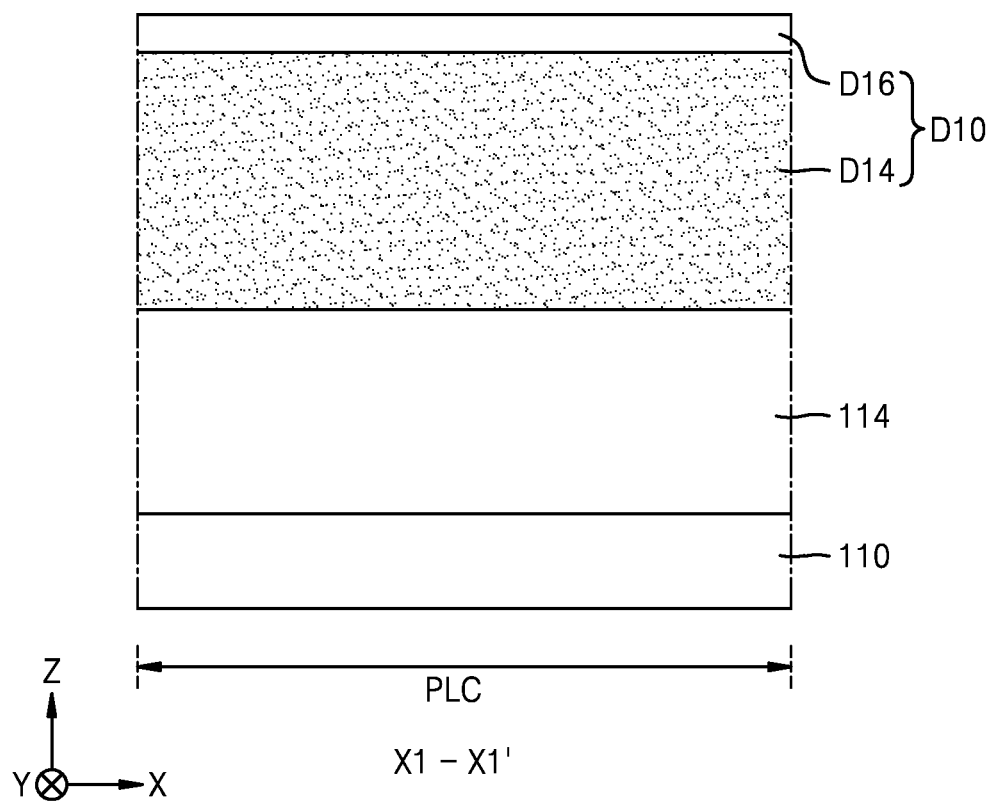
Figure 2D:
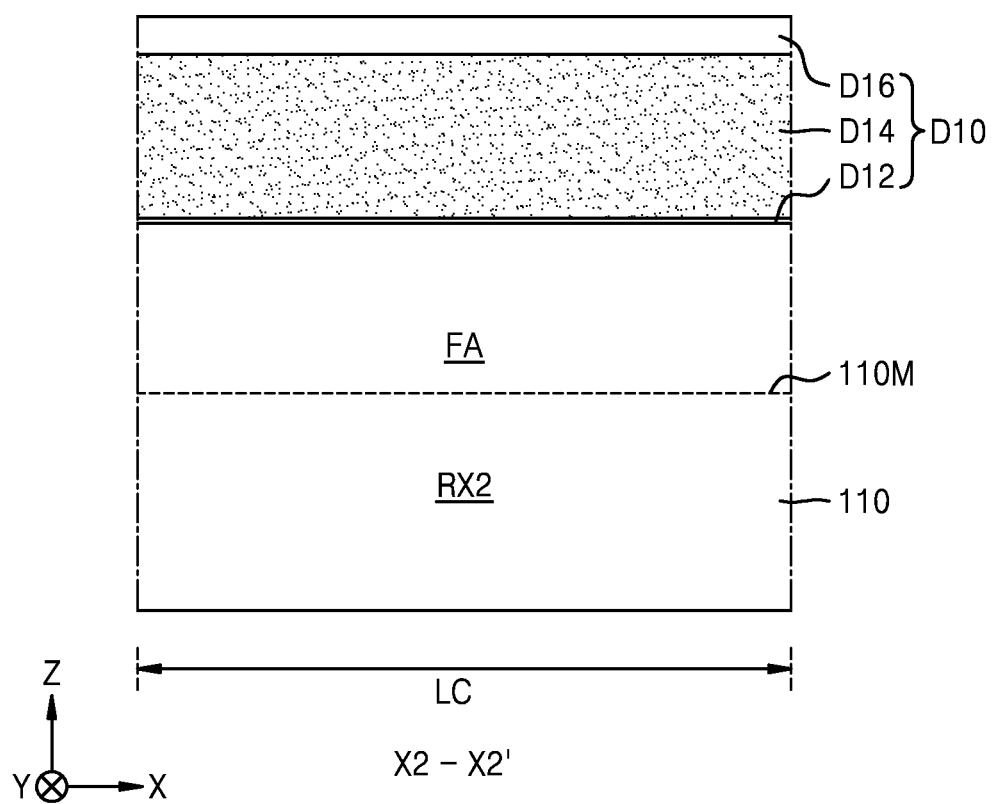
Figure 3A:
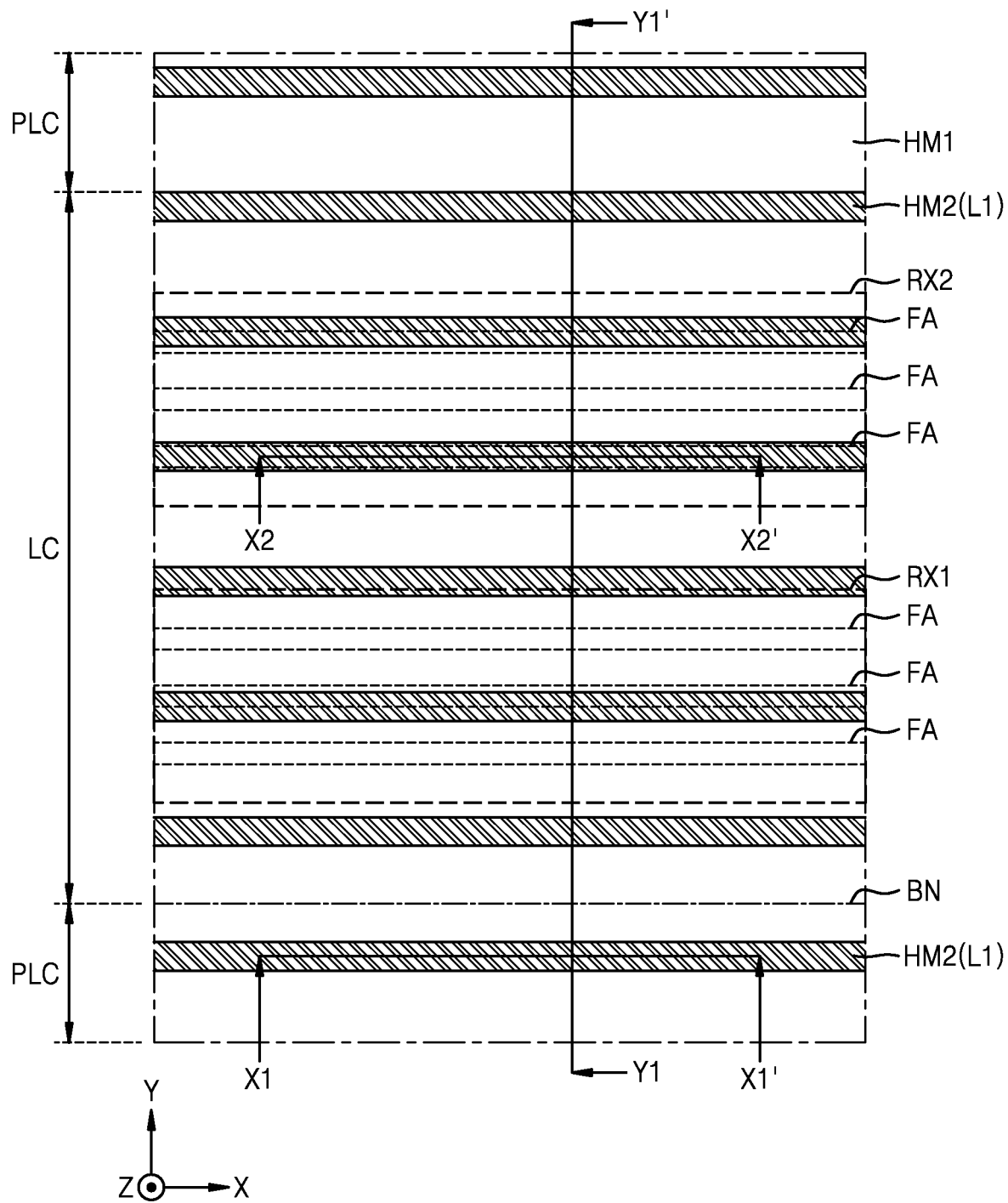
Figure 3B:
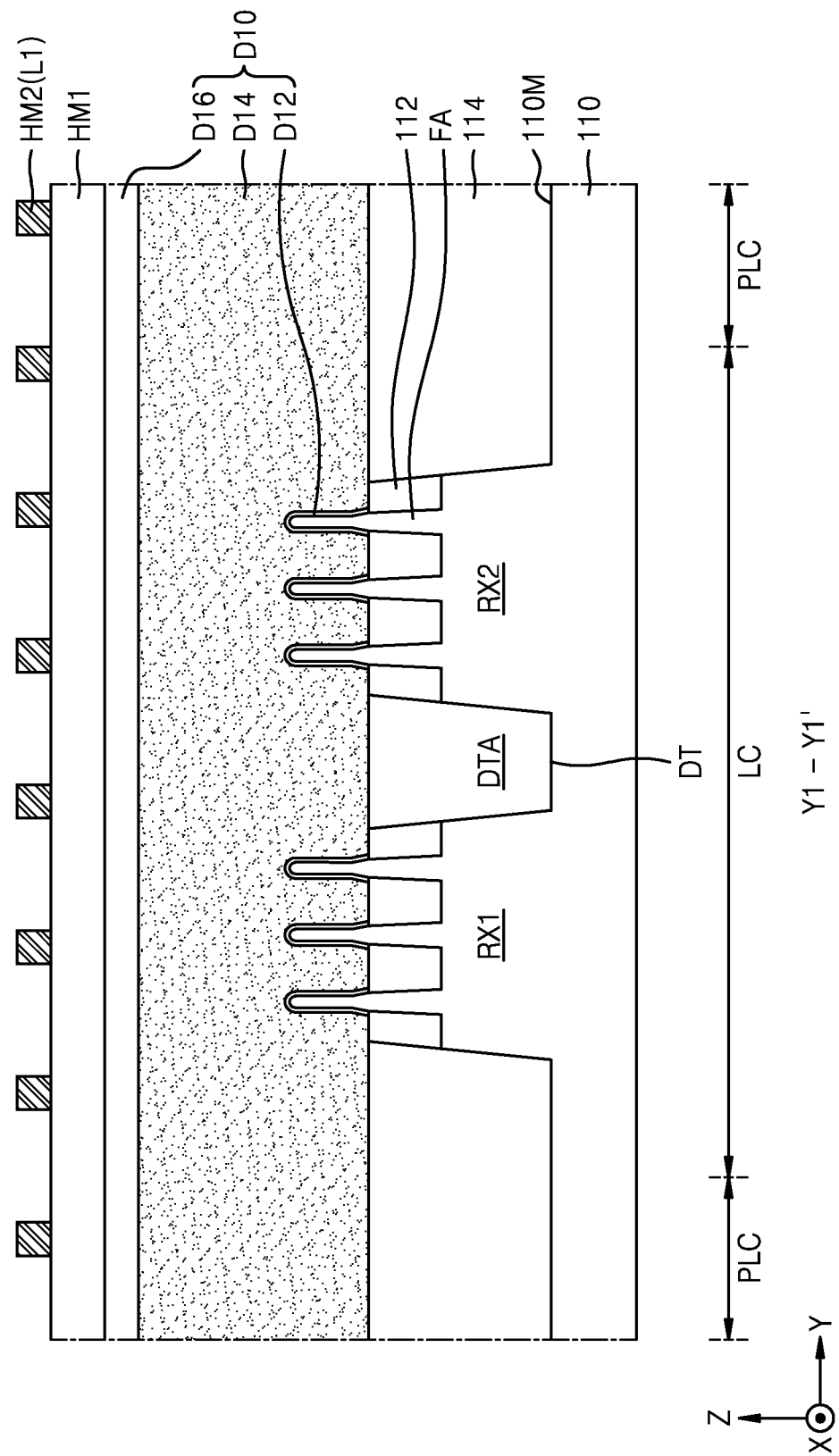
Figure 3C:
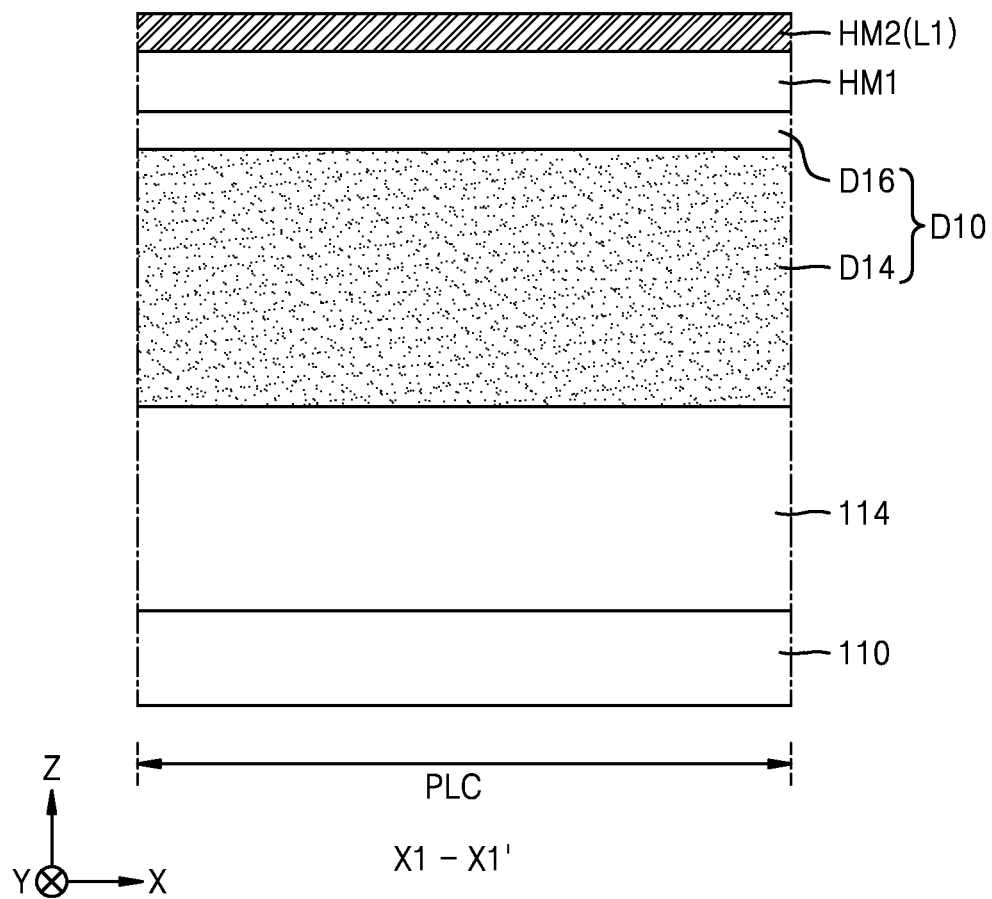
Figure 3D:
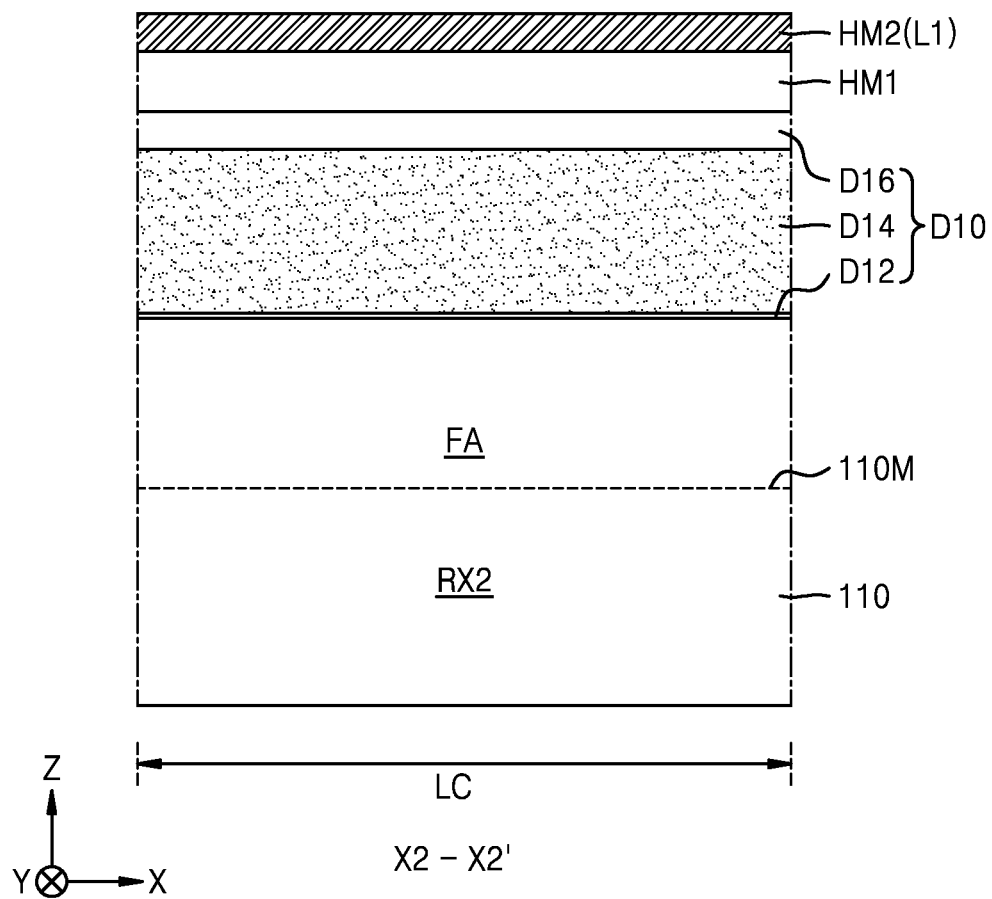

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

FIGS. 1A to 9D are diagrams illustrating a method of manufacturing an integrated circuit device 100 (see FIGS. 9A to 9D), according to some embodiments. More specifically, FIGS. 1A, 2A, 3A, 4A, 5A, 6A, 7A, 8A, and 9A are plan views respectively illustrating a sequence of processes of the method of manufacturing the integrated circuit device 100. FIGS. 1B, 2B, 3B, 4B, 5B, 6B, 7B, 8B, and 9B are cross-sectional views taken along lines Y1-Y1' of FIGS. 1A, 2A, 3A, 4A, 5A, 6A, 7A, 8A, and 9A, respectively. FIGS. 1C, 2C, 3C, 4C, 5C, 6C, 7C, 8C, and 9C are cross-sectional views taken along lines X1-X1' of FIGS. 1A, 2A, 3A, 4A, 5A, 6A, 7A, 8A, and 9A, respectively. FIGS. 1D, 2D, 3D, 4D, 5D, 6D, 7D, 8D, and 9D are cross-sectional views taken along lines X2-X2' of FIGS. 1A, 2A, 3A, 4A, 5A, 6A, 7A, 8A, and 9A, respectively.

Referring to FIGS. 1A to 1D, a substrate 110 may be prepared that may include a cell area LC and a cell peripheral area PLC around the cell area LC. The cell area LC may be defined by a cell boundary BN.

The substrate 110 may include a semiconductor, such as, but not limited to, silicon (Si) or germanium (Ge), and/or a compound semiconductor, such as, but not limited to, silicon—germanium (SiGe), silicon carbide (SiC), gallium arsenide (GaAs), indium arsenide (InAs), or indium phosphide (InP). Alternatively or additionally, the substrate 110 may include a conductive region, for example, an impurity-doped well and/or an impurity-doped structure. In some embodiments, the cell area LC may include a first device region RX1, a second device region RX2, and an inter-device isolation region DTA therebetween.

The substrate 110 in the first device region RX1 and the second device region RX2 may be partially etched, thereby forming a plurality of fin-type active regions FA, which protrude in a vertical direction (e.g., Z direction) from a main surface 110M of the substrate 110 and extend parallel to each other in a first horizontal direction (e.g., X direction).

In some embodiments, a device isolation film 112 may be formed to cover both sidewalls of a lower portion of each of the plurality of fin-type active regions FA. A deep trench DT may be formed to define the first device region RX1 and the second device region RX2 by etching a portion of the device isolation film 112 and a portion of the substrate 110. The deep trench DT may be filled with an inter-device isolation insulating film 114. In the first device region RX1 and the second device region RX2, the plurality of fin-type active regions FA may protrude upward from an upper surface of the device isolation film 112.

Referring to FIGS. 2A to 2D, a feature structure D10 may be formed to cover the plurality of fin-type active regions FA, the device isolation film 112, and the inter-device isolation insulating film 114.

The feature structure D10 may include a dummy gate insulating film D12, a dummy gate line D14, and a dummy insulating capping layer D16, which may be sequentially formed on the plurality of fin-type active regions FA in the stated order. That is, the dummy gate line D14 may be formed to cover the dummy gate insulating film D12, the device isolation film 112, and the inter-device isolation insulating film 114. Alternatively or additionally, the dummy insulating capping layer D16 may be formed to cover the dummy gate line D14. The feature structure D10 may have a planarized upper surface. In some embodiments, the dummy gate insulating film D12 may include a silicon oxide (SiO) film. Alternatively or additionally, the dummy gate line D14 may include a polysilicon film, and the dummy insulating capping layer D16 may include a silicon nitride (SiN) film.

Referring to FIGS. 3A to 3D, a first hardmask HM1 may be formed to cover the feature structure D10, and/or a second hardmask HM2 may be formed on the first hardmask HM1.

In some embodiments, the first hardmask HM1 may include a plurality of material layers, which respectively include different materials from each other and are sequentially stacked in the vertical direction. For example, the first hardmask HM1 may have, but is not limited to, a structure in which a silicon oxide film, a silicon nitride film, and a tetraethyl orthosilicate (TEOS) film that may be sequentially stacked in the stated order by an atomic layer deposition (ALD) process.

The second hardmask HM2 may include a plurality of first line portions L1, which extend lengthwise in the first horizontal direction (e.g., X direction) and are apart from each other in a second horizontal direction (e.g., Y direction) that is perpendicular to the first horizontal direction (e.g., X direction). The plurality of first line portions L1 of the second hardmask HM2 may extend parallel to each other in the first horizontal direction (e.g., X direction).

The second hardmask HM2 may include a single layer including a different material from a constituent material of an uppermost material layer contacting the second hardmask HM2 from among the plurality of material layers that constitute the first hardmask HM1. For example, the uppermost material layer of the first hardmask HM1 may include a silicon oxide film, and the second hardmask HM2 may include a silicon nitride film, but the present disclosure is not limited thereto.

Referring to FIGS. 4A to 4D, an etch mask pattern MPR, which may include a plurality of second line portions L2 may be formed on the first hardmask HM1 and the second hardmask HM2.

The plurality of second line portions L2 of the etch mask pattern MPR may extend lengthwise and parallel to each other in the second horizontal direction (e.g., Y direction) while being apart from each other in the first horizontal direction (e.g., X direction), on the first hardmask HM1 and the second hardmask HM2.

The etch mask pattern MPR may include a bottom anti-reflective coating (BARC) 118, which may contact each of the first hardmask HM1 and the second hardmask HM2, and a photoresist pattern PR, which may be arranged on the BARC 118 to cover each of the first hardmask HM1 and the second hardmask HM2. Each of the plurality of second line portions L2 may include a portion of the photoresist pattern PR and a portion of the BARC 118.

In some embodiments, the photoresist pattern PR may include a resist for extreme ultraviolet (EUV) light (e.g., light having a wavelength of approximately 13.5 nanometers (nm)). In some embodiments, the BARC 118 may include an organic compound, an inorganic compound, or a combination thereof. For example, the BARC 118 may include, but not be limited to, silicon nitride, silicon oxynitride, amorphous silicon, titanium, titanium dioxide, titanium nitride, chromium oxide, carbon, an organic anti-reflective coating (ARC) material, or a combination thereof. The organic ARC material may include, but not be limited to, an acrylic resin having a hydroxyl group (e.g., a crosslinking group and an optical absorption group in the same molecule), or a novolac resin having a hydroxyl group.

Figure 4A:
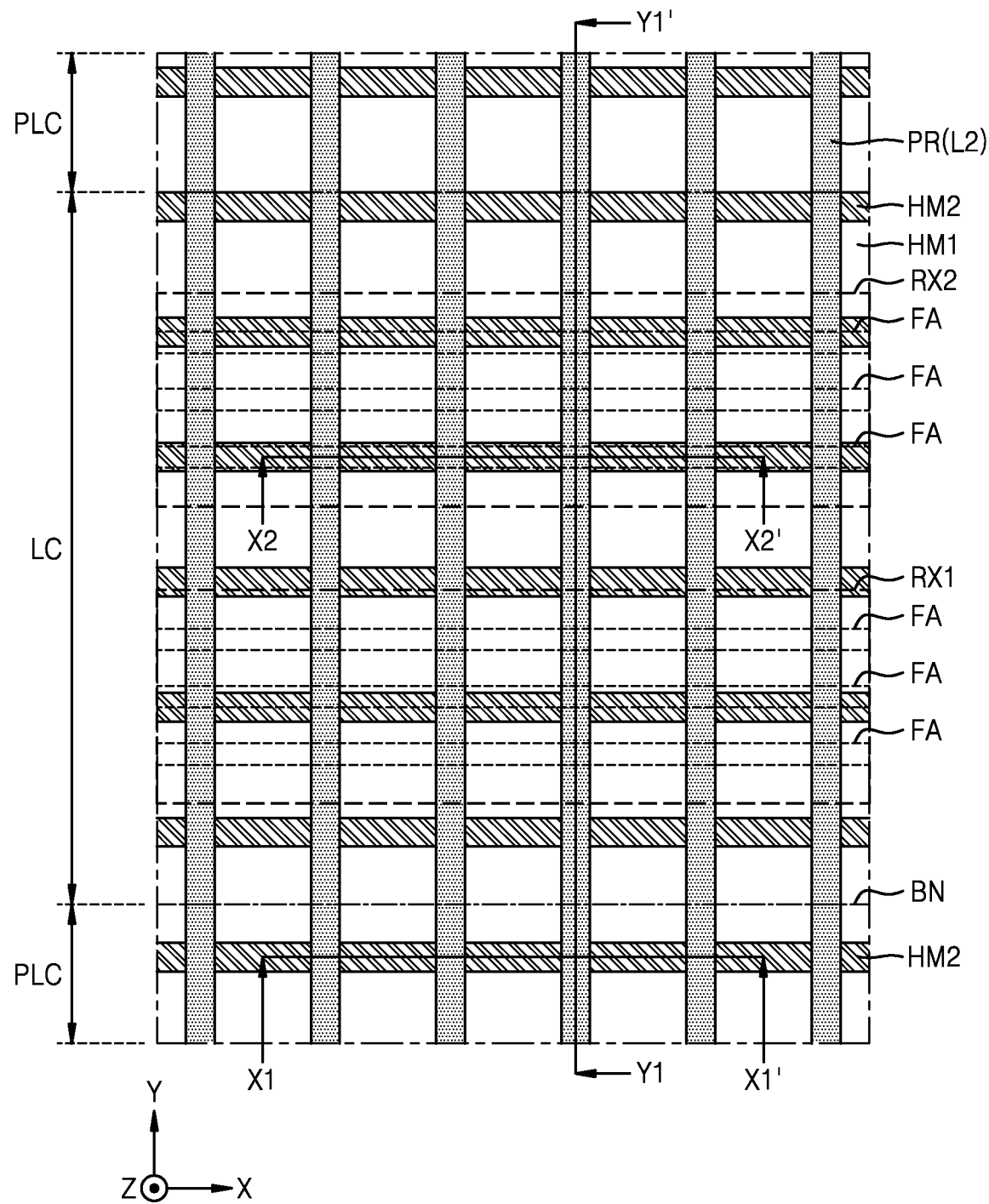
Figure 4B:
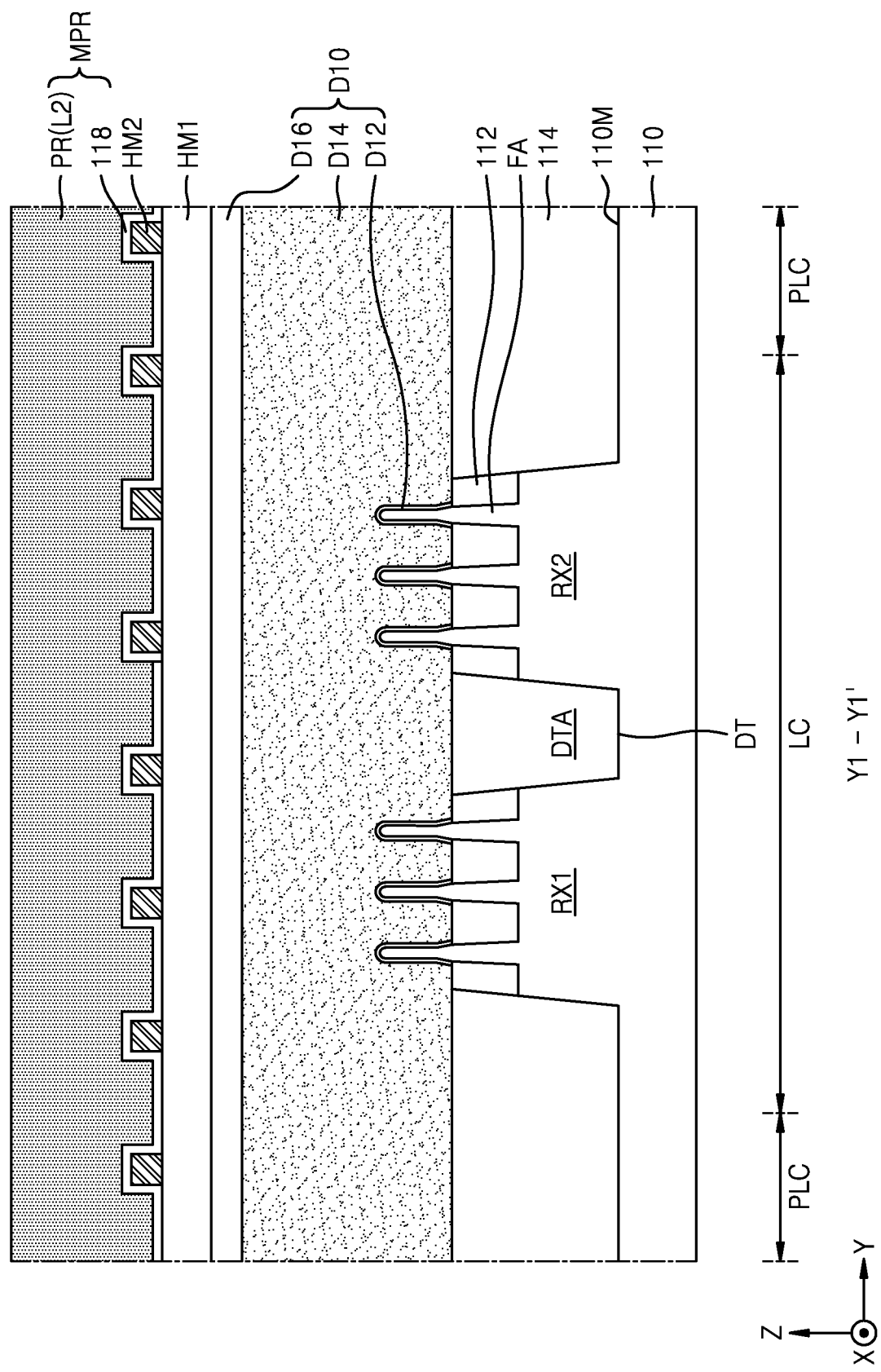
Figure 4C:
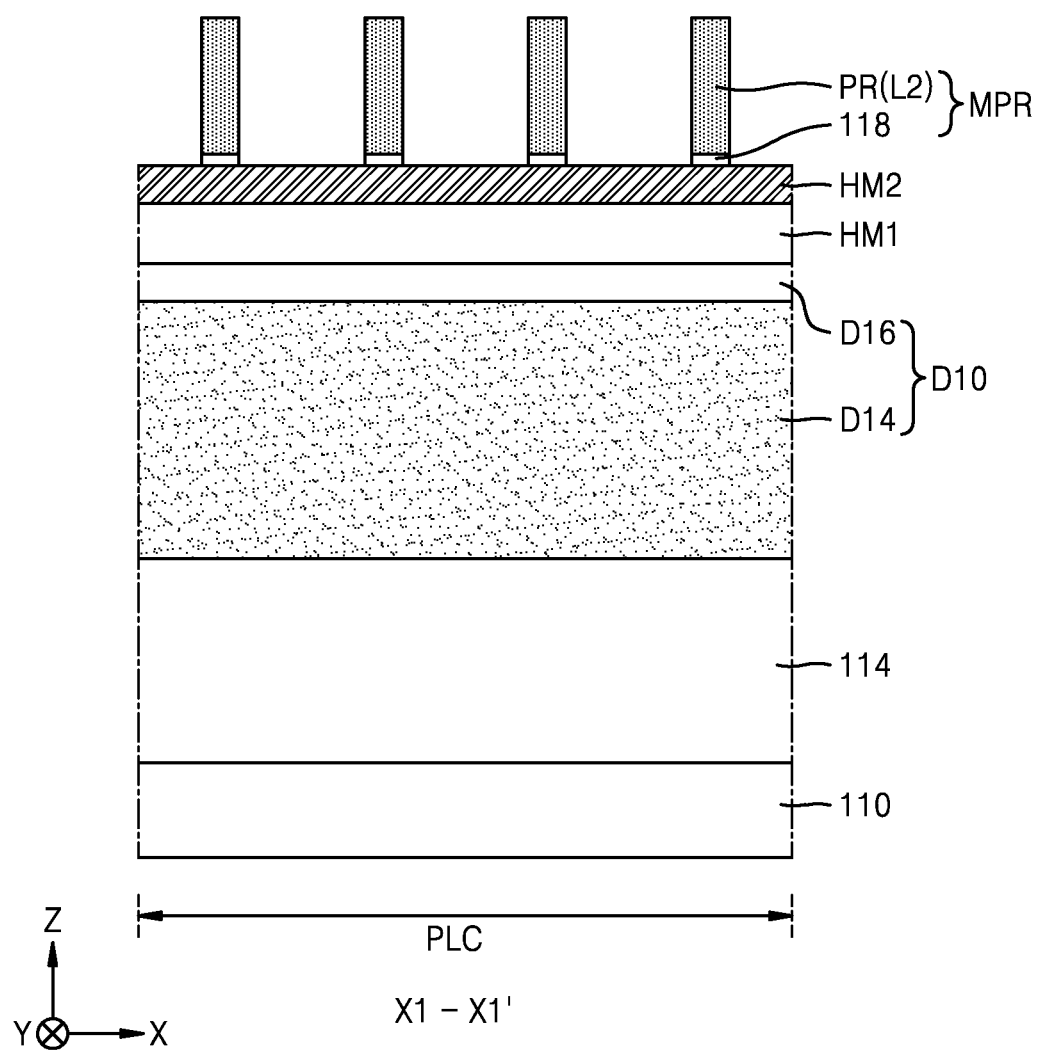
Figure 4D:
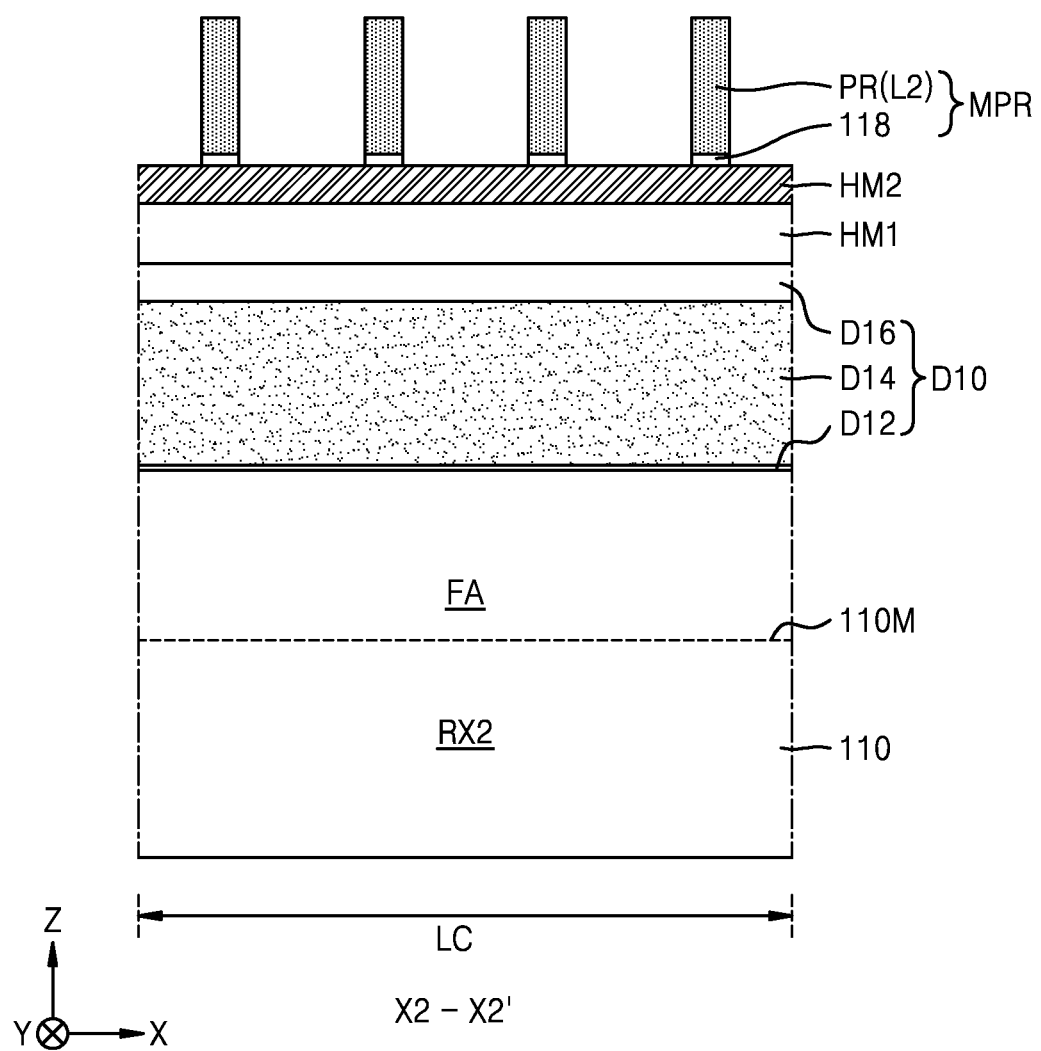
Figure 5A:
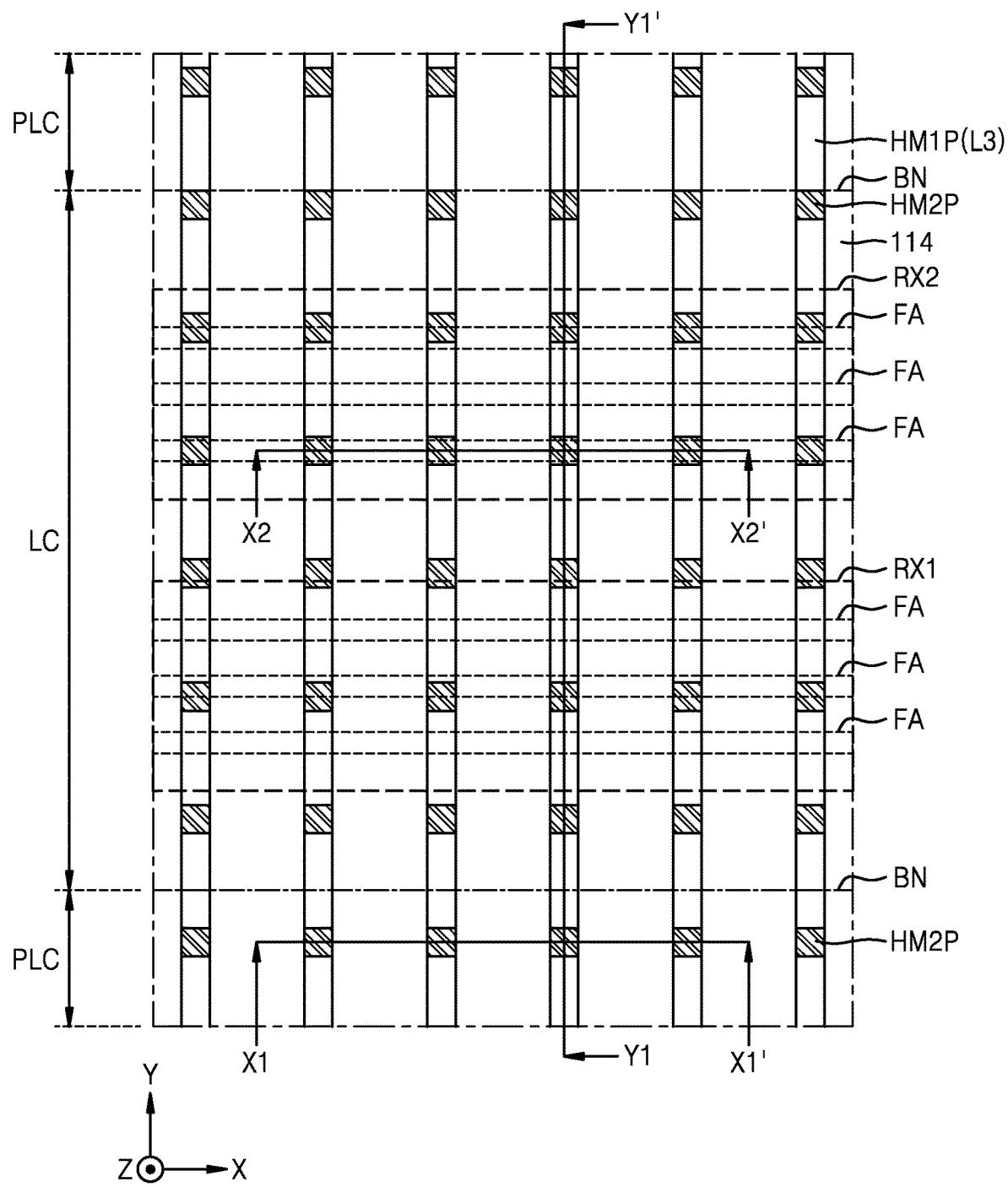
Figure 5B:
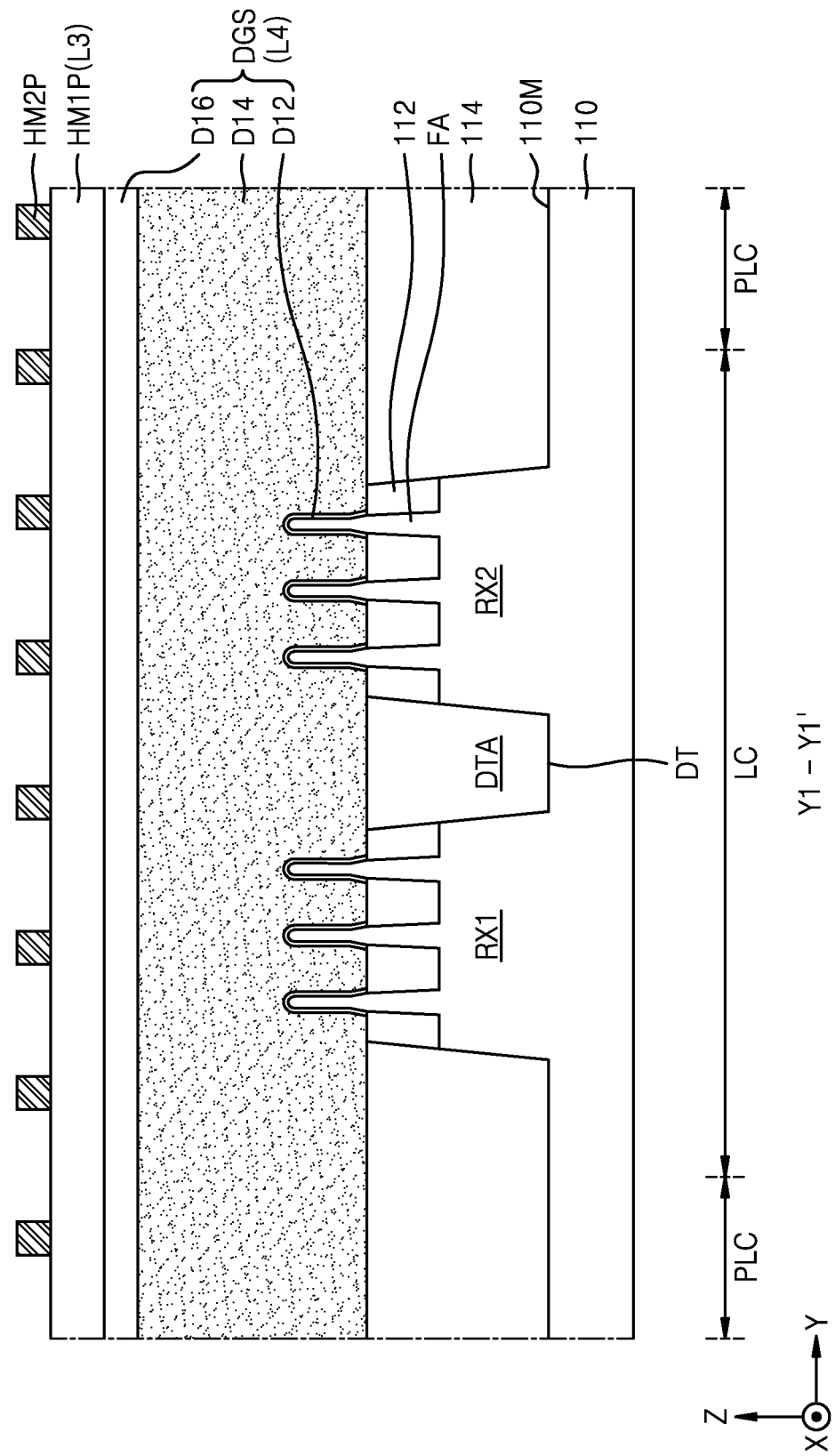
Figure 5C:
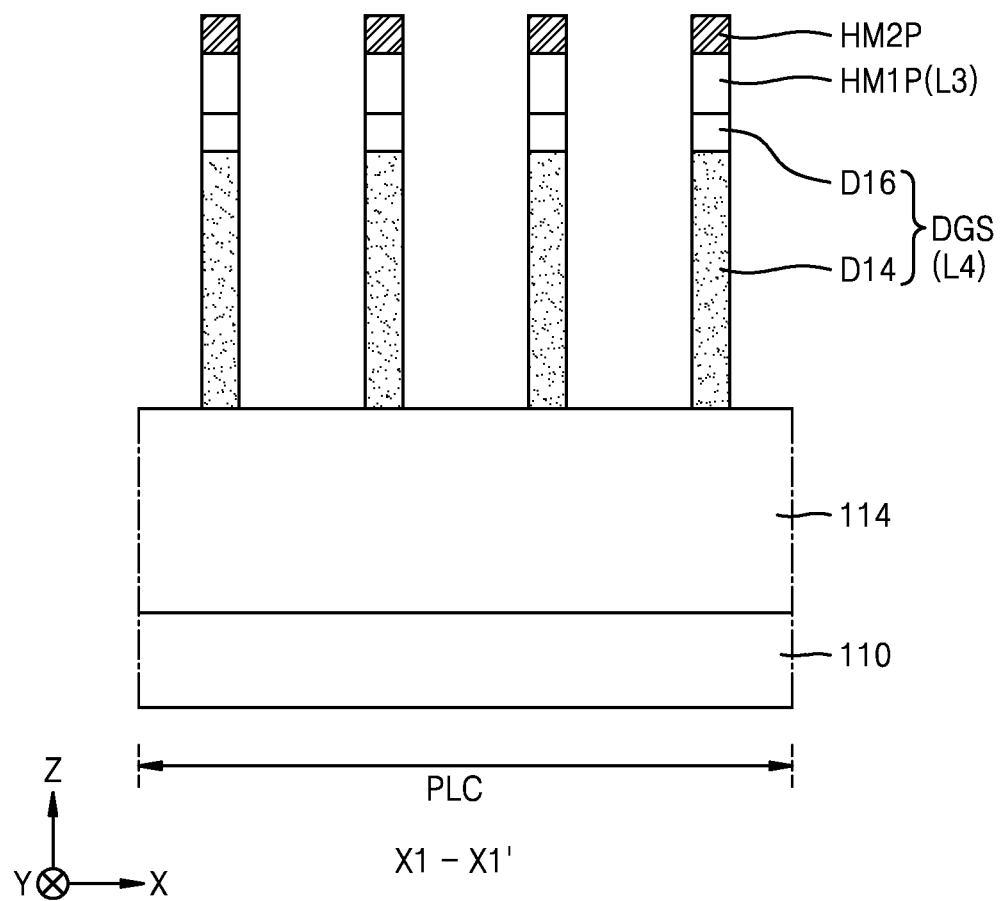
Figure 5D:
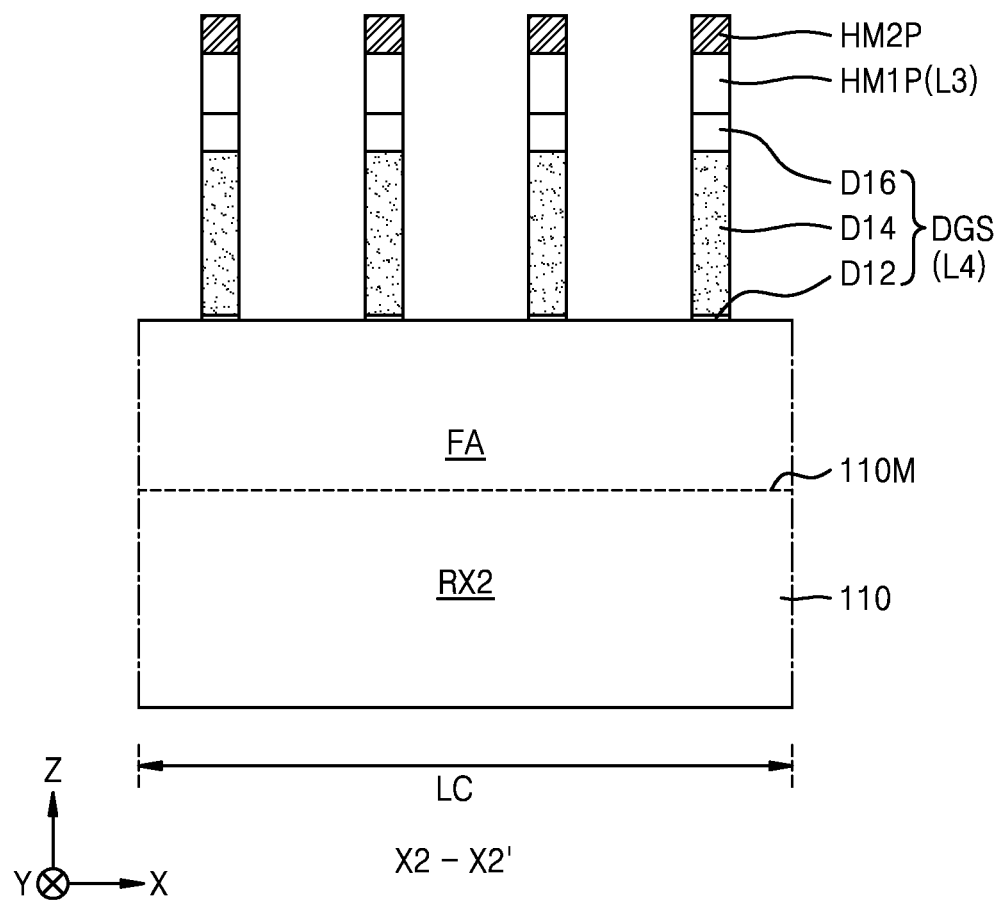
Figure 6A:
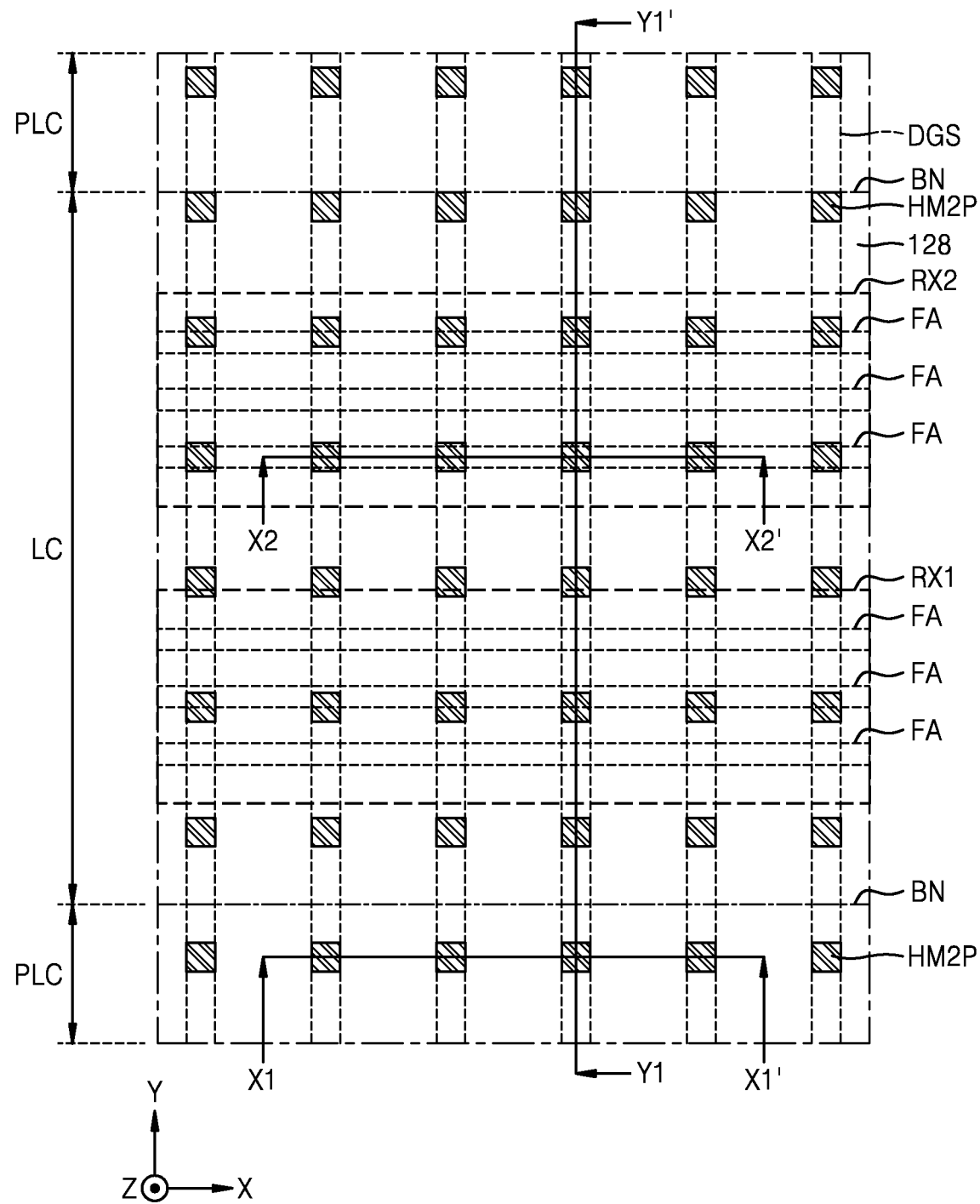
Figure 6B:
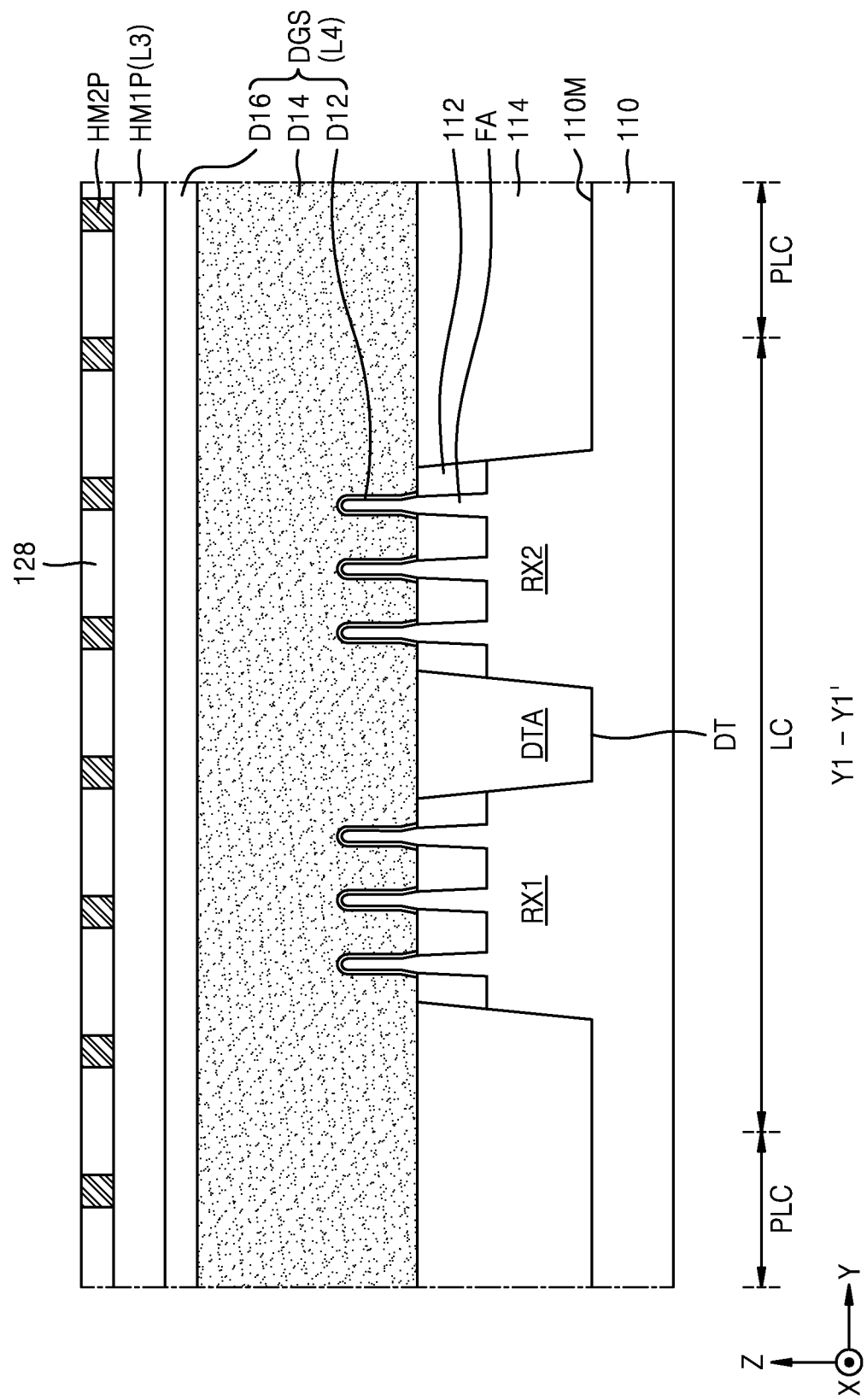
Figure 6C:
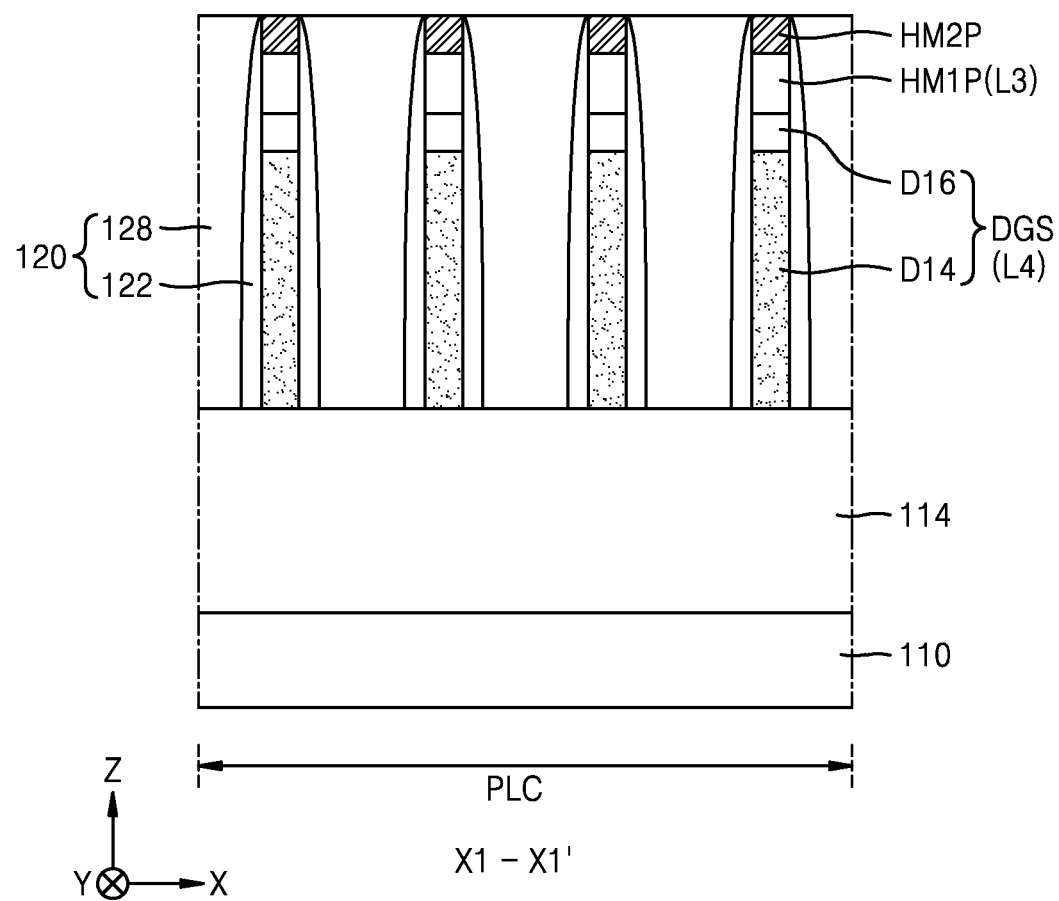
Figure 6D:
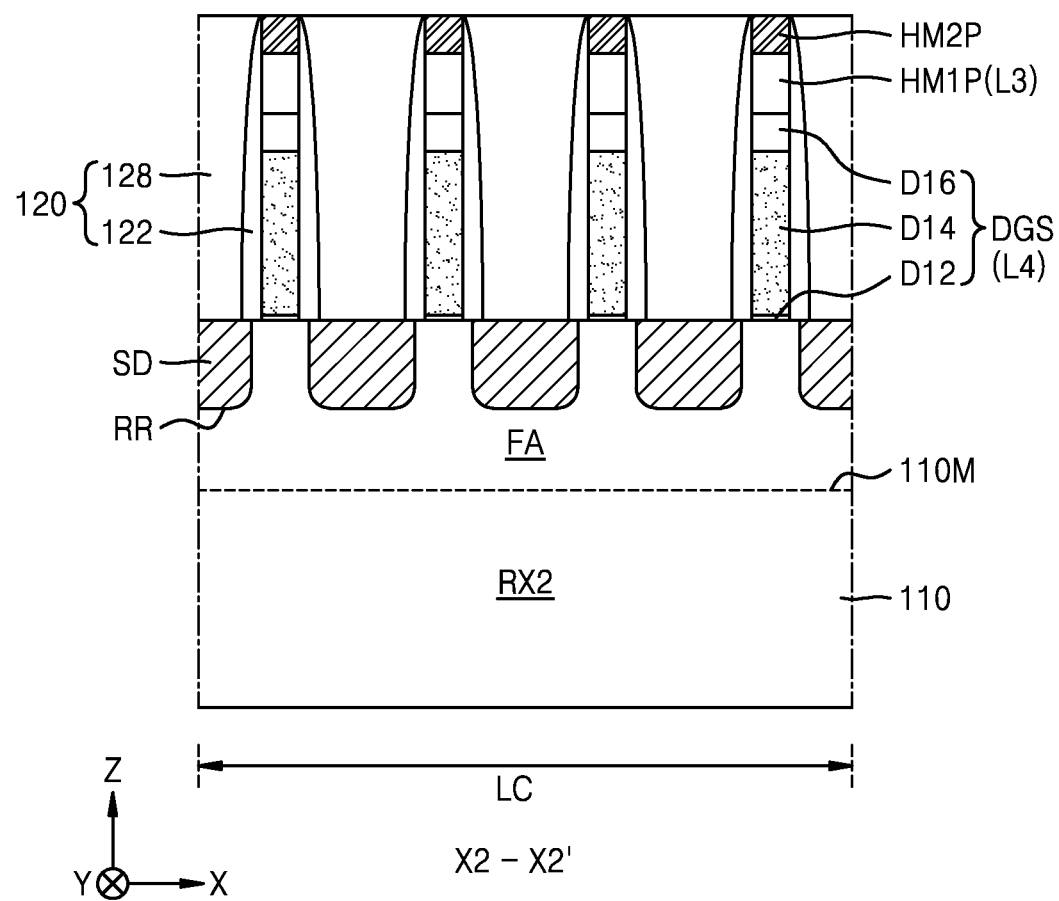
Figure 7A:
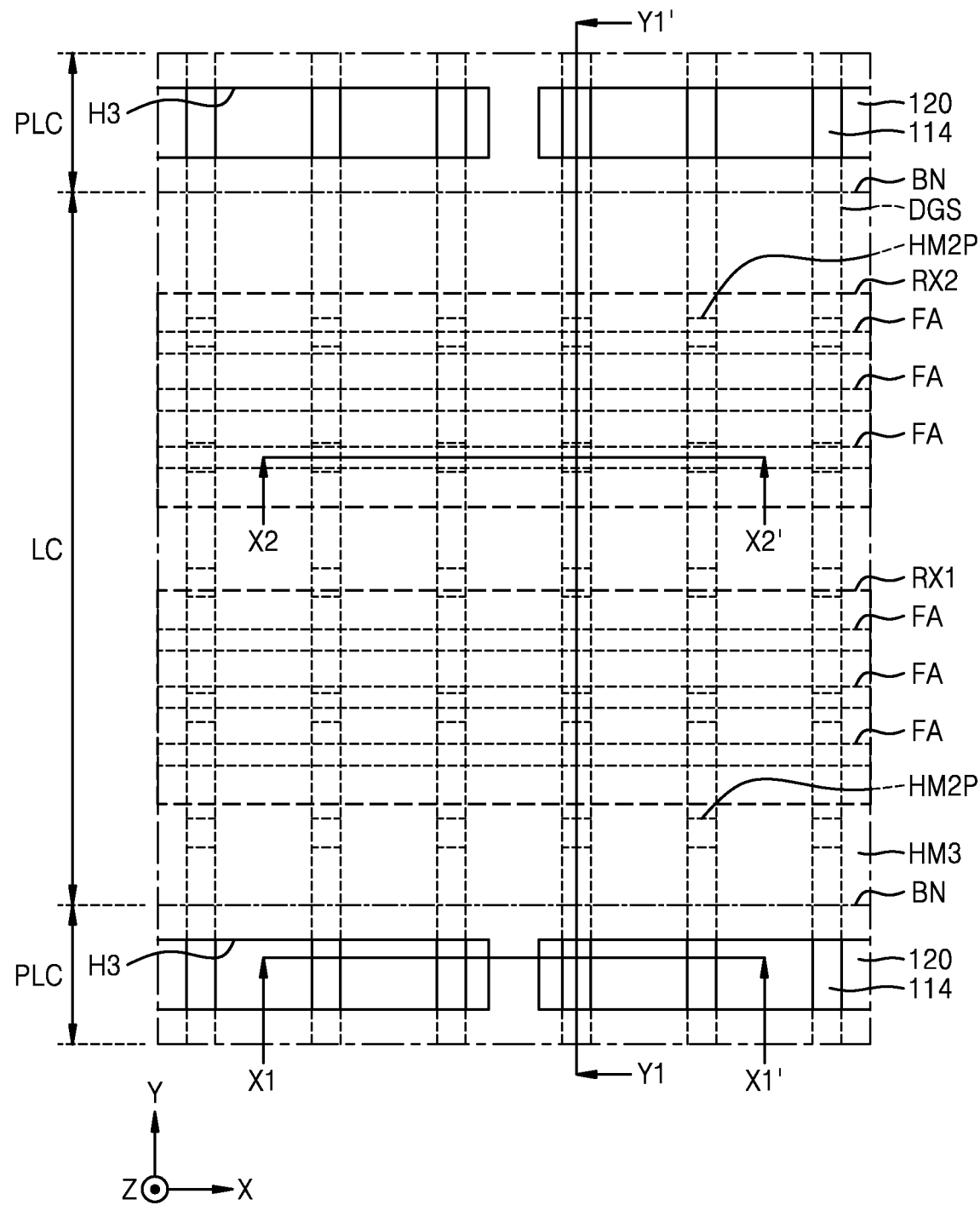
Figure 7C:
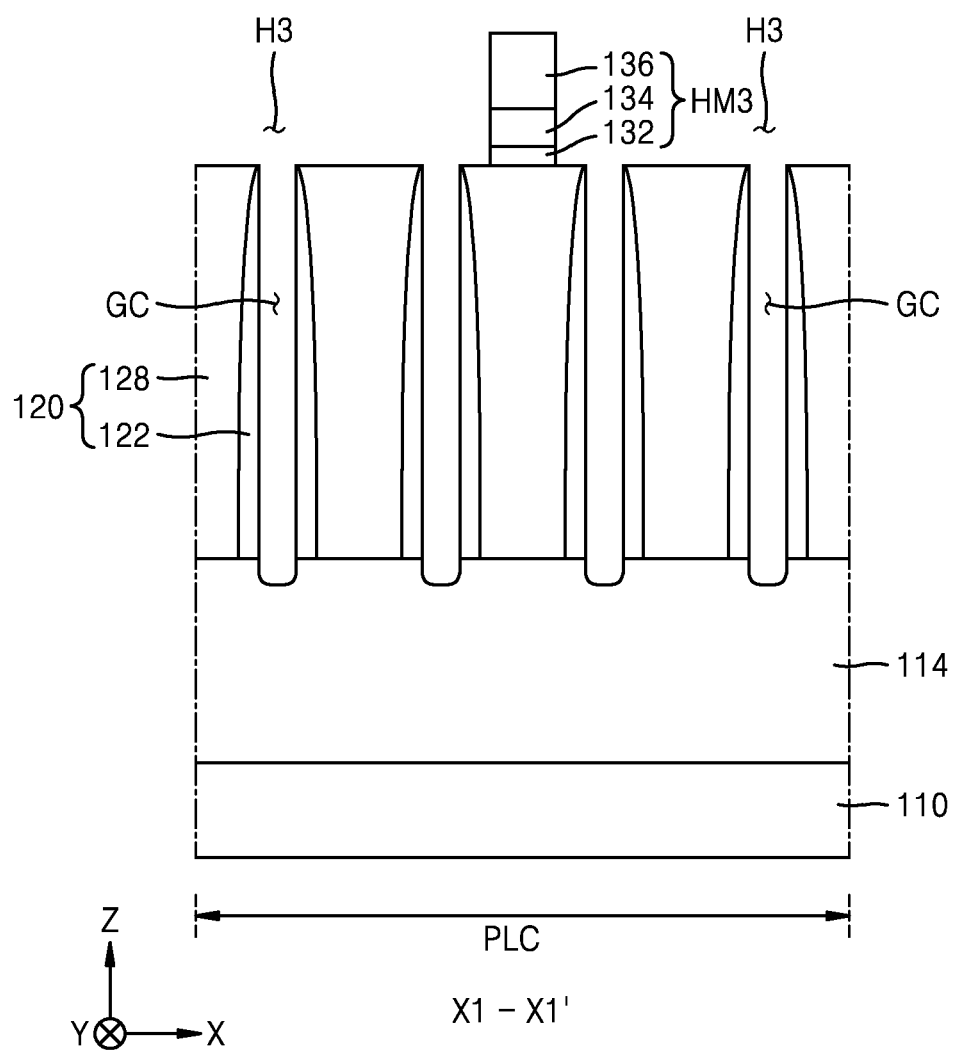
Figure 7D:
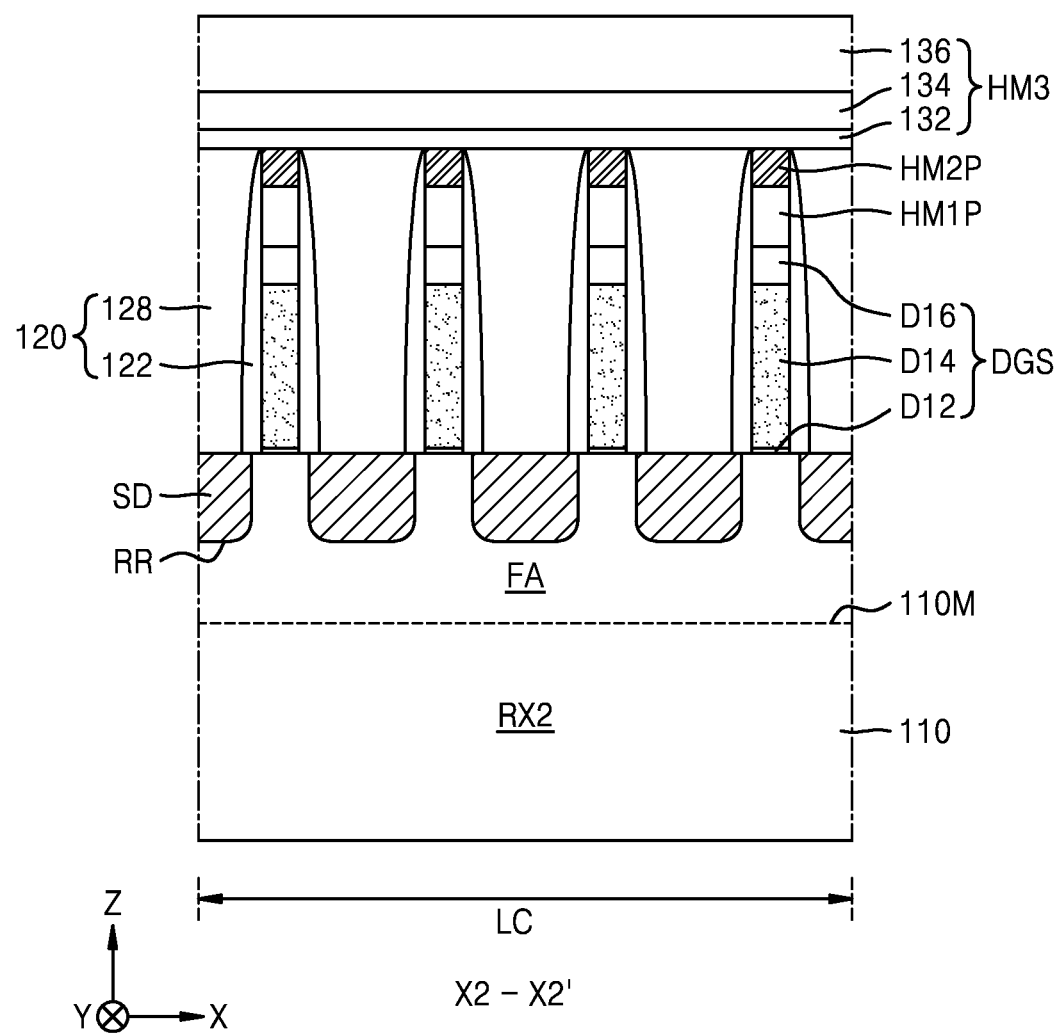
Figure 8A:
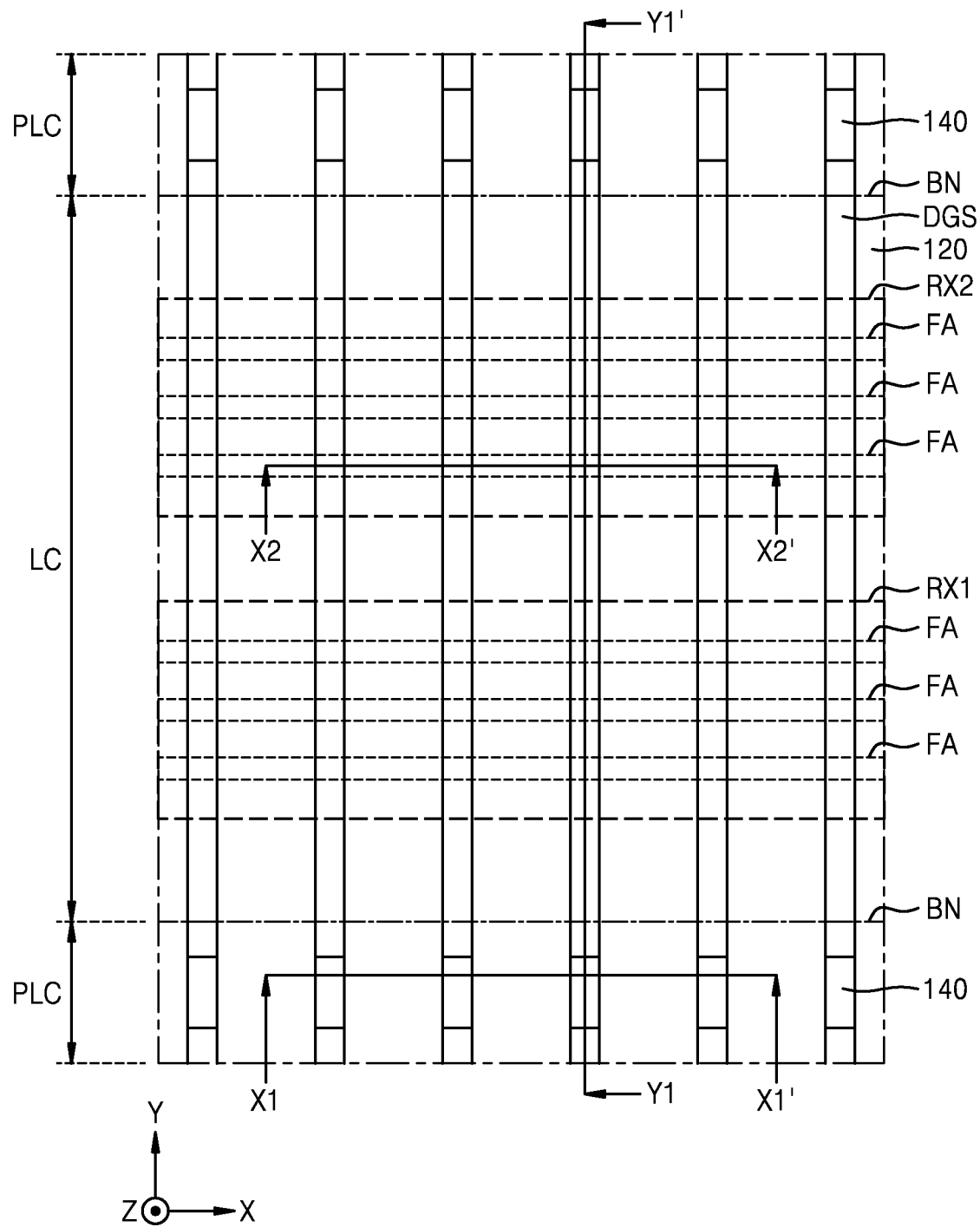
Figure 8B:
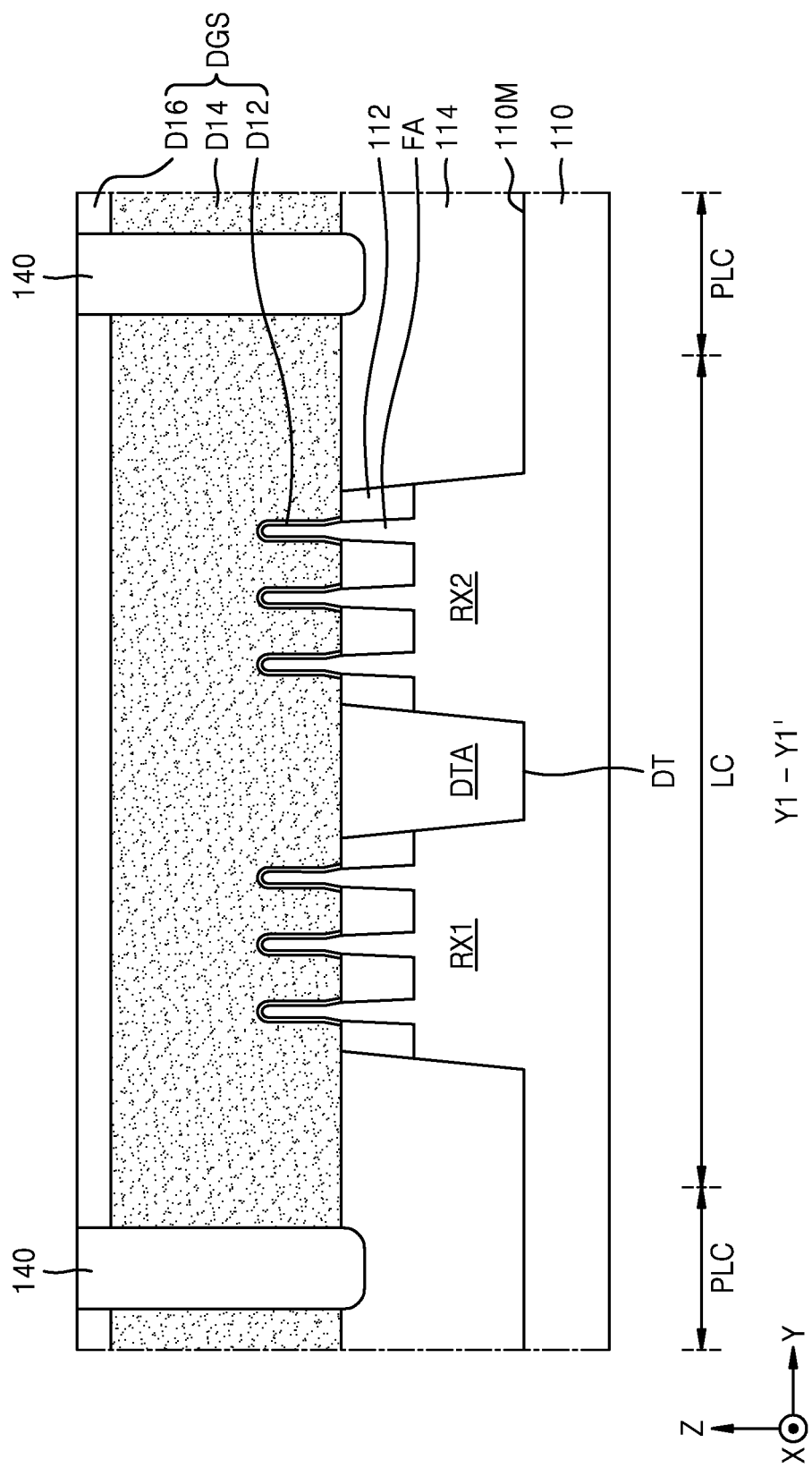
Figure 8C:
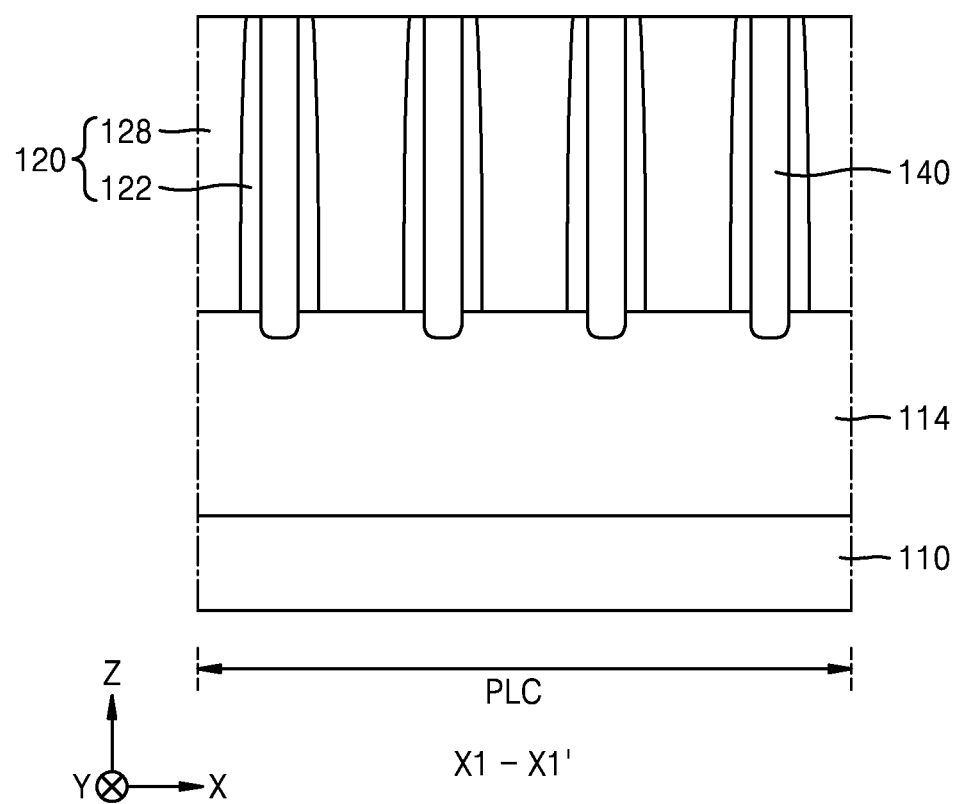
Figure 8D:
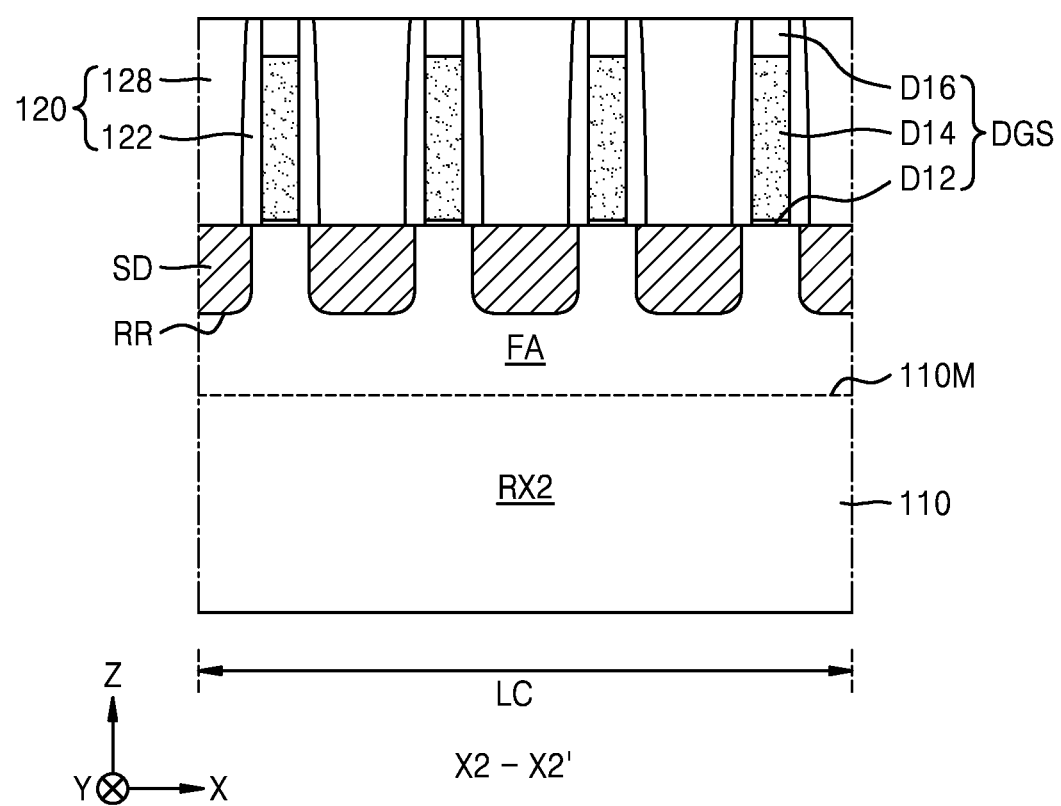

As shown in FIG. 4B, each of the plurality of second line portions L2 of the etch mask pattern MPR may be formed to cover a sidewall and an upper surface of each of the plurality of first line portions L1 of the second hardmask HM2. Accordingly, the etch mask pattern MPR may include a plurality of uneven portions at a lower surface thereof facing the substrate 110. For example, the plurality of uneven portions may have uneven shapes corresponding to the plurality of first line portions L1 of the second hardmask HM2, respectively.

In some embodiments, the plurality of second line portions L2 of the etch mask pattern MPR may be supported by the second hardmask HM2 arranged thereunder. Therefore, process defects (e.g., the unintended leaning or collapse of the plurality of second line portions L2 of the etch mask pattern MPR) may be prevented, and the plurality of second line portions L2 of the etch mask pattern MPR may maintain stable shapes thereof during a subsequent process using the etch mask pattern MPR after the etch mask pattern MPR is formed.

Figure 10:
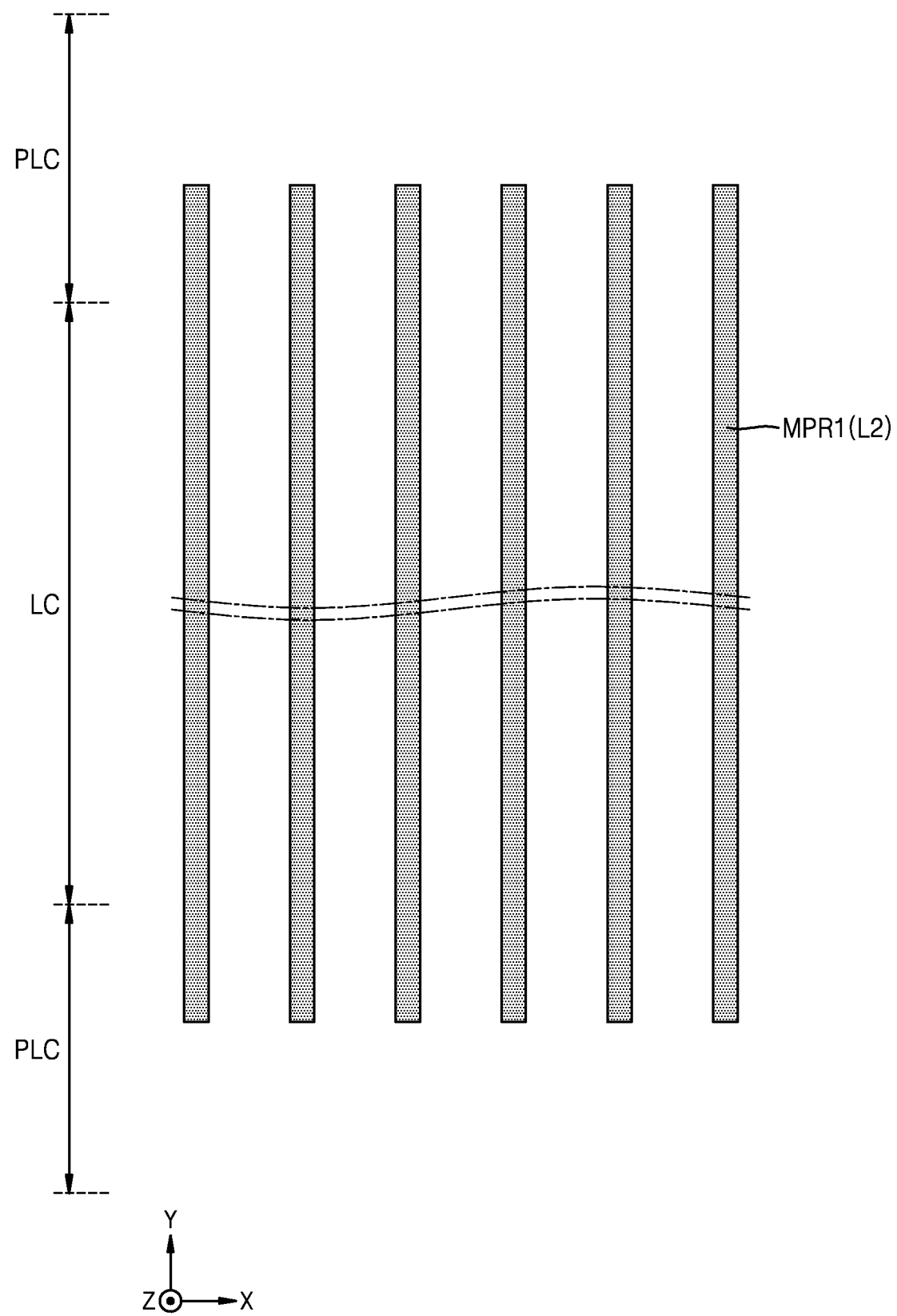
FIGS. 10 to 12 are plan views respectively illustrating various planar shapes of an etch mask pattern that may be formed by a method of manufacturing an integrated circuit device, according to some embodiments.
Figure 11:
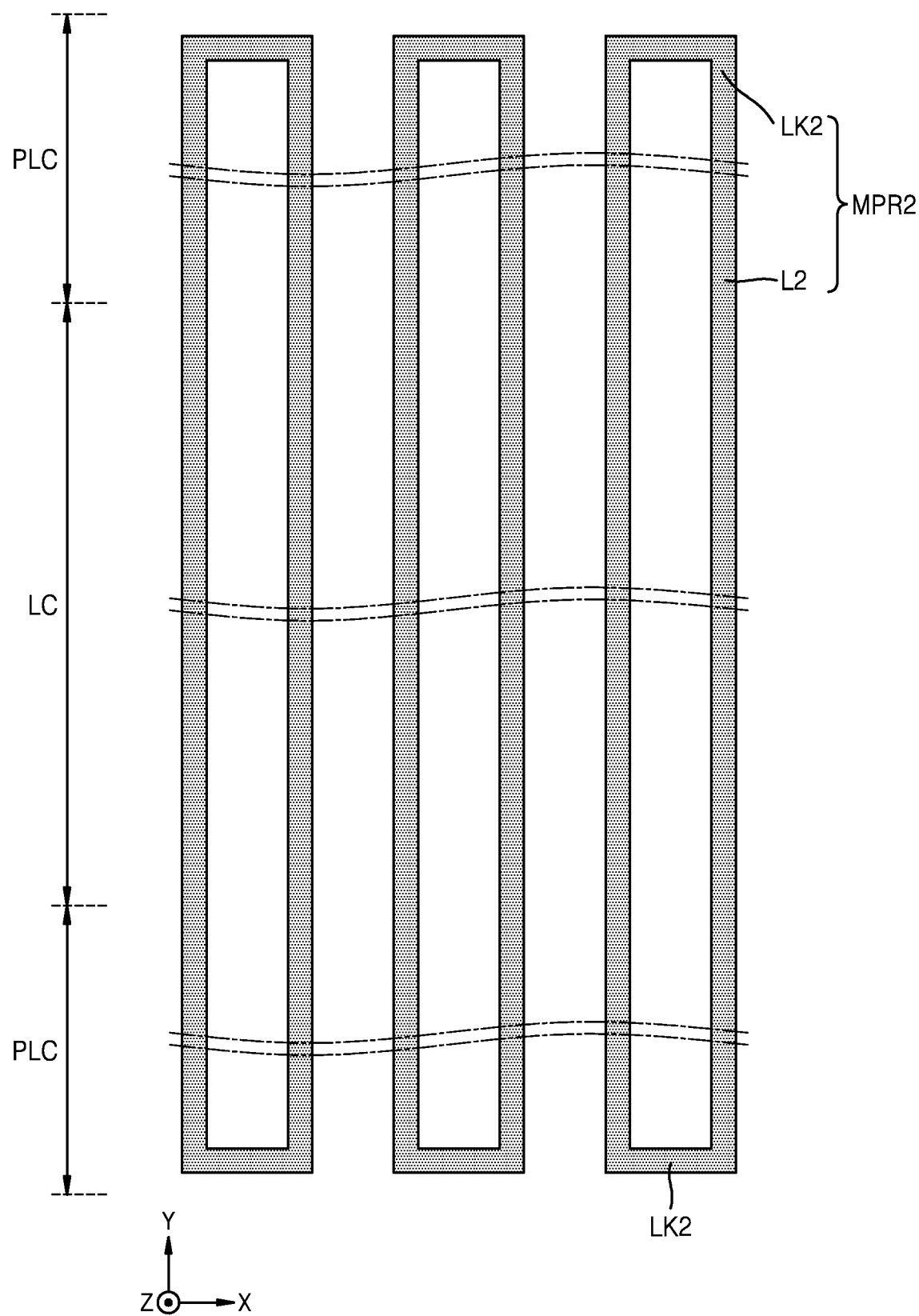
Figure 12:
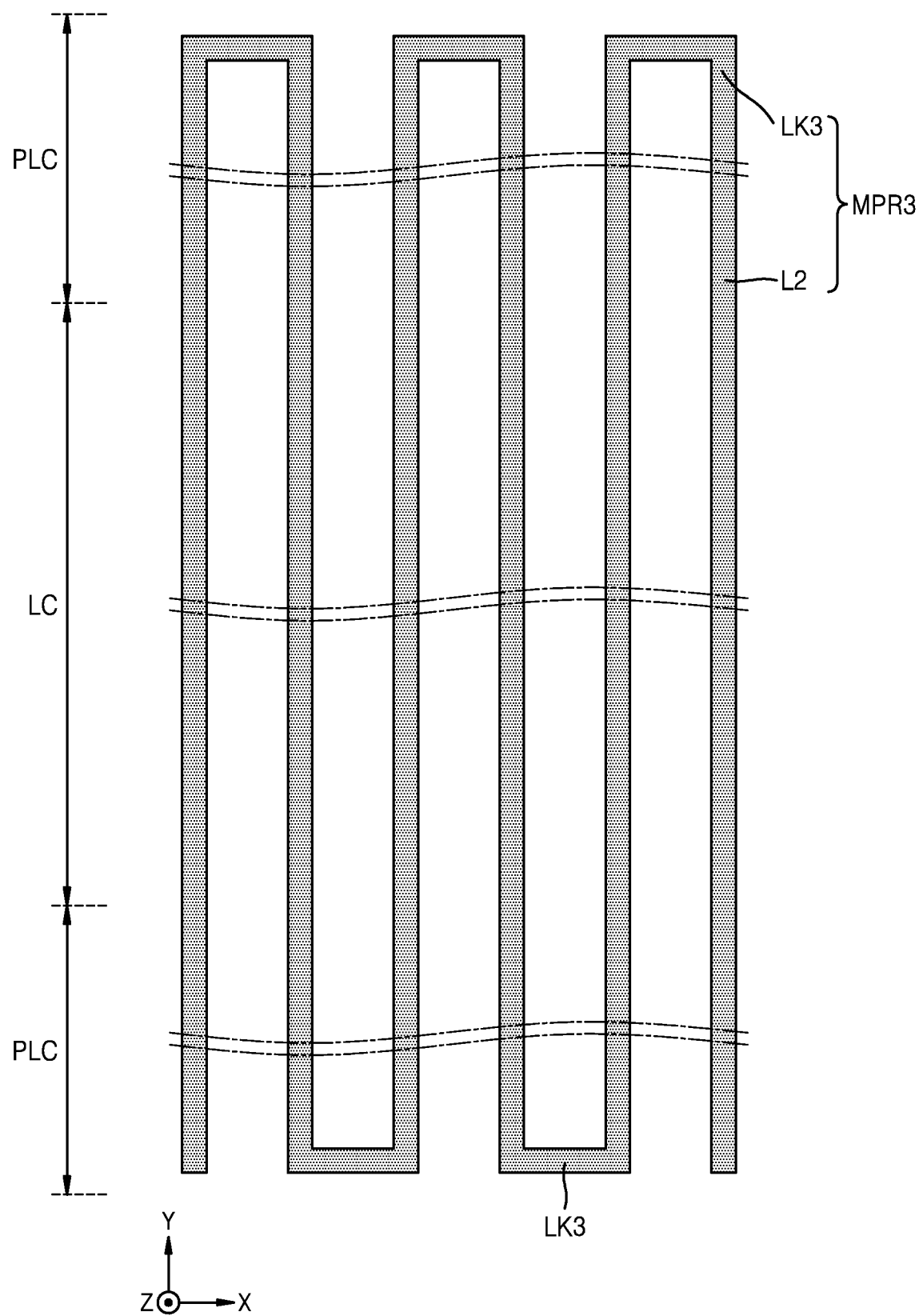

FIGS. 10 to 12 are plan views respectively illustrating various planar shapes of the etch mask pattern MPR shown in FIGS. 4A to 4D.

In some embodiments, referring to FIGS. 4A to 4D, the etch mask pattern MPR may include an etch mask pattern MPR1 including only the plurality of second line portions L2, as shown in FIG. 10. That is, the plurality of second line portions L2 may be arranged throughout the cell area LC and the cell peripheral area PLC.

Continuing to refer to FIGS. 4A to 4D, in some embodiments, the etch mask pattern MPR may include an etch mask pattern MPR2 including the plurality of second line portions L2 and a plurality of connection portions LK2. The plurality of connection portions LK2 may be connected between two second line portions L2 that are selected from the plurality of second line portions L2 and may be adjacent to each other, as shown in FIG. 11.

In the etch mask pattern MPR, the plurality of second line portions L2 may be arranged throughout the cell area LC and the cell peripheral area PLC, and the plurality of connection portions LK2 may be arranged in the cell peripheral area PLC. Each of the plurality of connection portions LK2 may be connected to an end of each of the two second line portions L2 to connect the two second line portions L2 to each other. The two second line portions L2 may be selected from the plurality of second line portions L2 and may be adjacent to each other. The etch mask pattern MPR2 may include a portion having a planar shape of a ring, which may be formed by the two second line portions L2 and two connection portions LK2 connecting the two second line portions L2 to each other.

In some embodiments, the etch mask pattern MPR, as shown in FIGS. 4A to 4D, may include an etch mask pattern MPR3 including the plurality of second line portions L2 and a plurality of connection portions LK3. The plurality of connection portions LK3 may be connected between two second line portions L2 that are selected from the plurality of second line portions L2 and may be adjacent to each other, as shown in FIG. 12.

In the etch mask pattern MPR3, the plurality of second line portions L2 may be arranged throughout the cell area LC and the cell peripheral area PLC, and the plurality of connection portions LK3 may be arranged in the cell peripheral area PLC. Similar to the plurality of connection portions LK2 shown in FIG. 11, each of the plurality of connection portions LK3 may be connected to an end of each of the two second line portions L2 to connect the two second line portions L2 to each other. The two second line portions L2 may be selected from the plurality of second line portions L2 and may be adjacent to each other. In some embodiments, the etch mask pattern MPR3 may include a portion having a planar structure in which every two adjacent second line portions L2 are connected to each other by each of the plurality of connection portions LK3 to form a repetitive S-shape.

Referring to FIGS. 5A to 5D, the second hardmask HM2 and the first hardmask HM1 may be etched by using the etch mask pattern MPR as an etch mask. As a result, a first hardmask pattern HM1P including a plurality of third line portions L3, which are parallel to each other, may be formed from the first hardmask HM1, and a plurality of second hardmask patterns HM2P, which respectively include a plurality of island patterns on the first hardmask pattern HM1P, may be formed from the second hardmask HM2.

The feature structure D10 may be etched by using the plurality of second hardmask patterns HM2P and the first hardmask pattern HM1P as an etch mask, thereby forming a plurality of dummy gate structures DGS. The plurality of dummy gate structures DGS may respectively include a plurality of fourth line portions L4 extending lengthwise in the second horizontal direction (e.g., Y direction). The plurality of fourth line portions L4, which are respectively included in the plurality of dummy gate structures DGS, may be apart from each other in the first horizontal direction (e.g., X direction) and extend parallel to each other in the second horizontal direction (e.g., Y direction). Herein, the plurality of dummy gate structures DGS may be referred to as a feature pattern.

Each of the plurality of fourth line portions L4, which are respectively included in the plurality of dummy gate structures DGS, may include a portion of the dummy gate insulating film D12, a portion of the dummy gate line D14, and a portion of the dummy insulating capping layer D16.

The plurality of dummy gate structures DGS may have various planar shapes, similar to the description made regarding various planar shapes of the etch mask pattern MPR as shown in FIGS. 4A to 4D with reference to FIGS. 10 to 12. In some embodiments, the plurality of dummy gate structures DGS may respectively include only the plurality of fourth line portions L4, similar to the etch mask pattern MPR1 shown in FIG. 10. In some embodiments, each of the plurality of dummy gate structures DGS may include a dummy connection portion connected to ends of two fourth line portions L4 adjacent to each other from among the plurality of fourth line portions L4 such that the two adjacent fourth line portions L4 are connected to each other by the dummy connection portion, similar to the etch mask pattern MPR2 shown in FIG. 11. In some embodiments, the dummy connection portion may have a planar shape that is the same as or similar to that of the connection portion LK2 shown in FIG. 10.

Referring to FIGS. 6A to 6D, in a resulting product of FIGS. 5A to 5D, a plurality of insulating spacers 122 may be formed to cover both sidewalls of each of the plurality of dummy gate structures DGS, and portions of the plurality of fin-type active regions FA, which are exposed on both sides of each of the plurality of dummy gate structures DGS. In some embodiments, the plurality of fin-type active regions FA may be etched, thereby forming a plurality of recess regions RR in an upper surface of each of the plurality of fin-type active regions FA. A plurality of source/drain regions SD may be formed to respectively fill the plurality of recess regions RR. Additionally or alternatively, an inter-gate dielectric 128 may be formed to fill each space between the plurality of dummy gate structures DGS. The inter-gate dielectric 128 may be formed to cover the plurality of insulating spacers 122, the device isolation film 112, the inter-device isolation insulating film 114, and the plurality of source/drain regions SD.

An insulating spacer 122 and the inter-gate dielectric 128 may constitute an insulating structure 120. In the insulating structure 120, the inter-gate dielectric 128 may fill each space, which may be defined by the insulating spacer 122, between the plurality of dummy gate structures DGS.

In some embodiments, each of the plurality of insulating spacers 122 may include a portion extending in a line shape in the second horizontal direction (e.g., Y direction). The insulating spacer 122 may include, but not be limited to, a silicon nitride (SiN) film, a silicon oxycarbonitride (SiOCN) film, silicon carbonitride (SiCN) film, or a combination thereof. The inter-gate dielectric 128 may include, but is not limited to, a silicon oxide (SiO) film. In some embodiments, before the inter-gate dielectric 128 is formed, the method of manufacturing the integrated circuit device 100 may further include a process of forming an insulating liner (not shown) to cover the plurality of insulating spacers 122 and the plurality of source/drain regions SD. The insulating liner may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon oxide (SiO), or a combination thereof. As used herein, each of the terms "SiN", "SiCN", "SiBN", "SiON", "SiOCN", "SiBCN", "SiOC", and "SiO" may refer to a material made of elements included in each of the terms and is not a chemical formula representing a stoichiometric relationship.

The insulating structure 120 may cover a sidewall of each of the plurality of fourth line portions L4 of the plurality of dummy gate structures DGS, a sidewall of each of the plurality of third line portions L3 of the first hardmask pattern HM1P, and a sidewall of each of the plurality of second hardmask patterns HM2P. An upper surface of the insulating structure 120 and an upper surface of each of the plurality of second hardmask patterns HM2P may extend in a horizontal direction at the same vertical level or respectively at similar vertical levels. As used herein, the term "vertical level" may refer to a distance in the vertical direction (e.g., Z direction) from the main surface 110M of the substrate 110.

Referring to FIGS. 7A to 7D, in a resulting product of FIGS. 6A to 6D, a third hardmask HM3 may be formed on the upper surface of each of the insulating structure 120 and the plurality of second hardmask patterns HM2P. The third hardmask HM3 may include a plurality of openings H3, which expose a portion of the insulating structure 120 and portions of the plurality of second hardmask patterns HM2P, in the cell peripheral area PLC.

In some embodiments, portions of the plurality of second hardmask patterns HM2P, a portion of the first hardmask pattern HM1P, and portions of the plurality of dummy gate structures DGS may be etched by using the third hardmask HM3 as an etch mask, thereby forming a plurality of cut spaces GC respectively in the plurality of dummy gate structures DGS.

The third hardmask HM3 may include a plurality of mask layers including different materials from each other. The plurality of mask layers may include a first mask layer 132, a second mask layer 134, and a third mask layer 136, which may be sequentially stacked in the stated order on the upper surface of each of the insulating structure 120 and the plurality of second hardmask patterns HM2P. In some embodiments, the first mask layer 132 may include a silicon oxide film formed by an ALD process, the second mask layer 134 may include a silicon nitride film, and the third mask layer 136 may include a TEOS film, but the present disclosure is not limited thereto.

In related techniques, to form the plurality of openings H3 in the third hardmask HM3, when the third mask layer 136, the second mask layer 134, and the first mask layer 132 are etched in the stated order from top to bottom, the insulating structure 120 exposed by the plurality of openings H3 may be partially recessed due to unintended over-etching. However, according to the method of manufacturing the integrated circuit device 100 provided by the present disclosure, when the third mask layer 136, the second mask layer 134, and the first mask layer 132 are etched in the stated order from top to bottom to form the plurality of openings H3 in the third hardmask HM3, the plurality of second hardmask patterns HM2P under the third hardmask HM3 may improve an etch mask function of the third hardmask HM3. Accordingly, the insulating structure 120 exposed by the plurality of openings H3 may be prevented from being partially recessed due to unintended over-etching. Therefore, unintended consumption of the insulating structure 120 may be suppressed while the plurality of openings H3 are formed in the third hardmask HM3, and thus, the reliability of the integrated circuit device 100 may be prevented from being deteriorated due to the damage to the insulating structure 120.

Alternatively or additionally, when forming the plurality of cut spaces GC, and the plurality of dummy gate structures DGS exposed by the plurality of openings H3 are etched, the insulating structure 120, together with the plurality of dummy gate structures DGS, may also be exposed by the plurality of cut spaces GC. Here, the plurality of second hardmask patterns HM2P under the third hardmask HM3 may improve the etch mask function of the third hardmask HM3, and thus, a selective etching process, in which only the plurality of dummy gate structures DGS from among the plurality of dummy gate structures DGS and the insulating structure 120 are selectively etched, may have an improved efficiency.

Referring to FIGS. 8A to 8D, after the third hardmask HM3, the plurality of second hardmask patterns HM2P, and the first hardmask pattern HM1P are removed from a resulting product of FIGS. 7A to 7D, a plurality of isolation insulating films 140 may be formed to respectively fill the plurality of cut spaces GC, and an upper surface of a resulting product, in which the plurality of isolation insulating films 140 are formed, may be planarized, thereby exposing an upper surface of the dummy insulating capping layer D16.

In some embodiments, each of the plurality of isolation insulating films 140 may include, but not be limited to, silicon nitride (SiN), silicon carbonitride (SiCN), silicon boron nitride (SiBN), silicon oxynitride (SiON), silicon oxycarbonitride (SiOCN), silicon boron carbonitride SiBCN), silicon oxycarbide (SiOC), silicon oxide (SiO), or a combination thereof.

Referring to FIGS. 9A to 9D, in a resulting product of FIGS. 8A to 8D, the dummy gate line D14 may be exposed by removing the dummy insulating capping layer D16 and insulating films therearound. Here, the inter-gate dielectric 128 and the plurality of insulating spacers 122 may be reduced in height.

For example, by removing a plurality of dummy gate lines D14 and a plurality of dummy gate insulating films D12, a plurality of gate spaces may be prepared to expose the insulating spacer 122, the plurality of fin-type active regions FA, the device isolation film 112, and the inter-device isolation insulating film 114, and a gate insulating film 152, a gate line GL, and a gate capping insulating line 154 may be formed in each of the plurality of gate spaces.

To form the gate insulating film 152, the gate line GL, and the gate capping insulating line 154, first, a plurality of gate insulating films 152 and a plurality of gate lines GL may be formed to respectively fill a plurality of gate spaces, followed by etching back the gate insulating film 152 and the gate line GL such that each of the plurality of gate insulating films 152 and each of the plurality of gate lines GL fill only a lower portion of each gate space. As a result, the heights of the gate insulating film 152 and the gate line GL may be reduced. During the etch-back of the gate insulating film 152 and the gate line GL, an upper portion of the insulating spacer 122 defining each of the plurality of gate spaces may also be removed, and thus, the height of the insulating spacer 122 may be reduced. The gate capping insulating line 154 may be formed in each of the plurality of gate spaces to cover an upper surface of each of the gate line GL, the gate insulating film 152, and the insulating spacer 122, and fill an upper portion of the gate space. The gate insulating film 152 and the gate line GL may constitute a gate line structure GLS.

In some embodiments, before the gate insulating film 152 is formed, an interfacial film (not shown) may be formed to cover a surface of each of the plurality of fin-type active regions FA exposed by the plurality of gate spaces. To form the interfacial film, portions of the plurality of fin-type active regions FA exposed by the plurality of gate spaces may be oxidized.

Figure 9A:
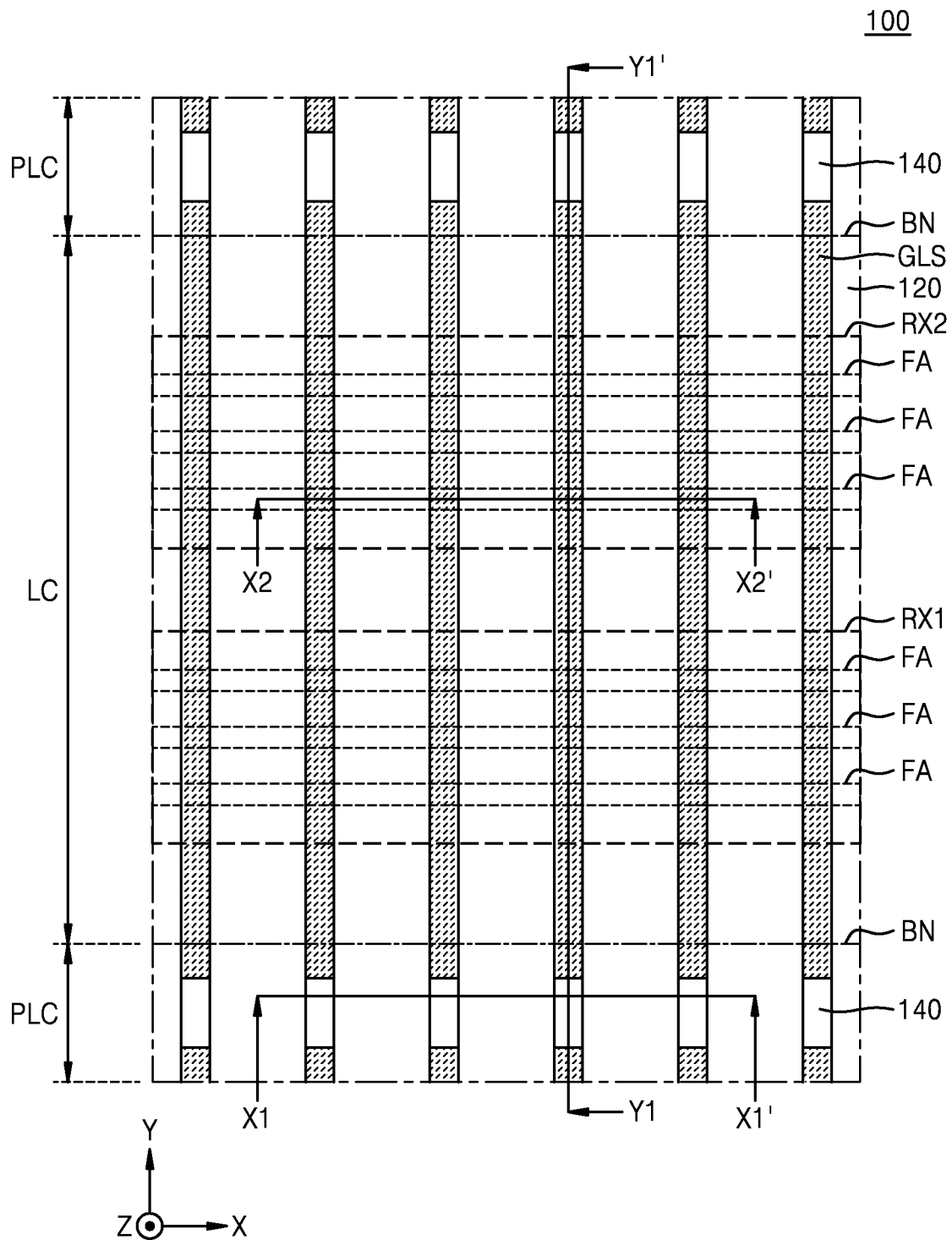
Figure 9B:
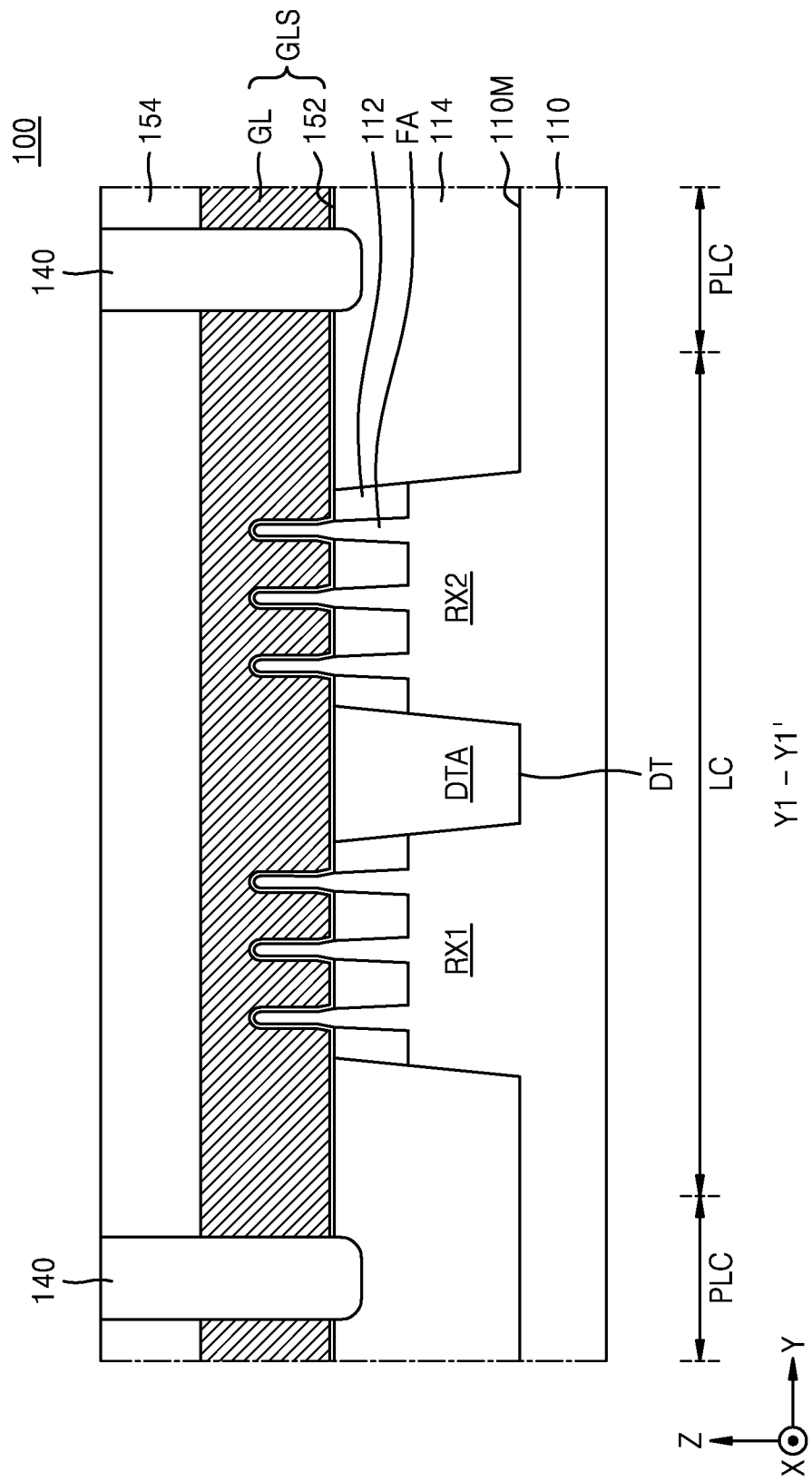
Figure 9C:
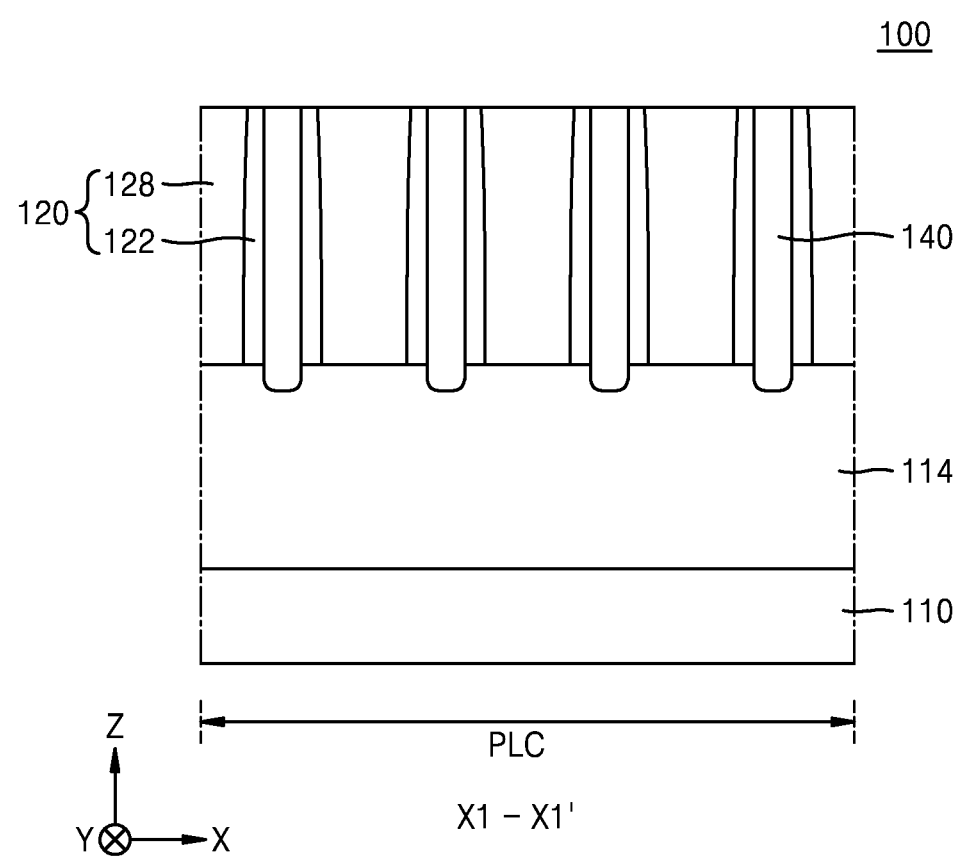
Figure 9D:
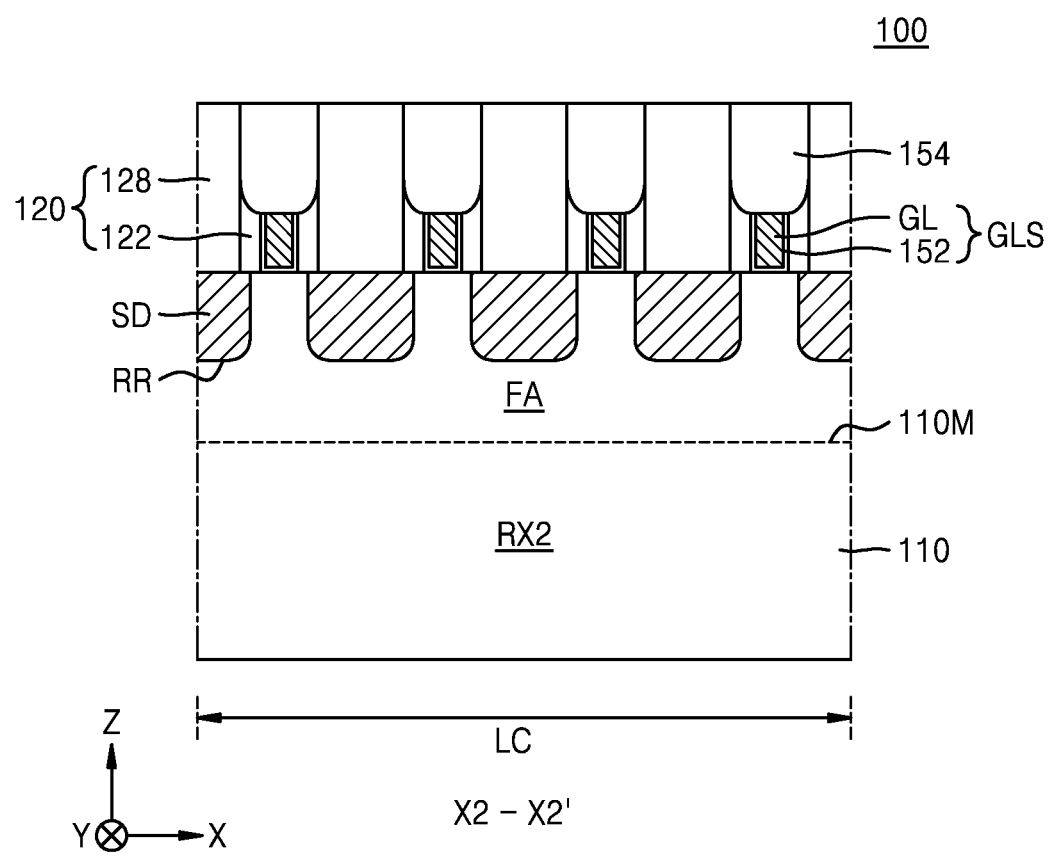

FIGS. 13 to 17 are plan views respectively illustrating various planar shapes of the gate line structure GLS shown in FIGS. 9A, 9B, and 9D.

Figure 13:
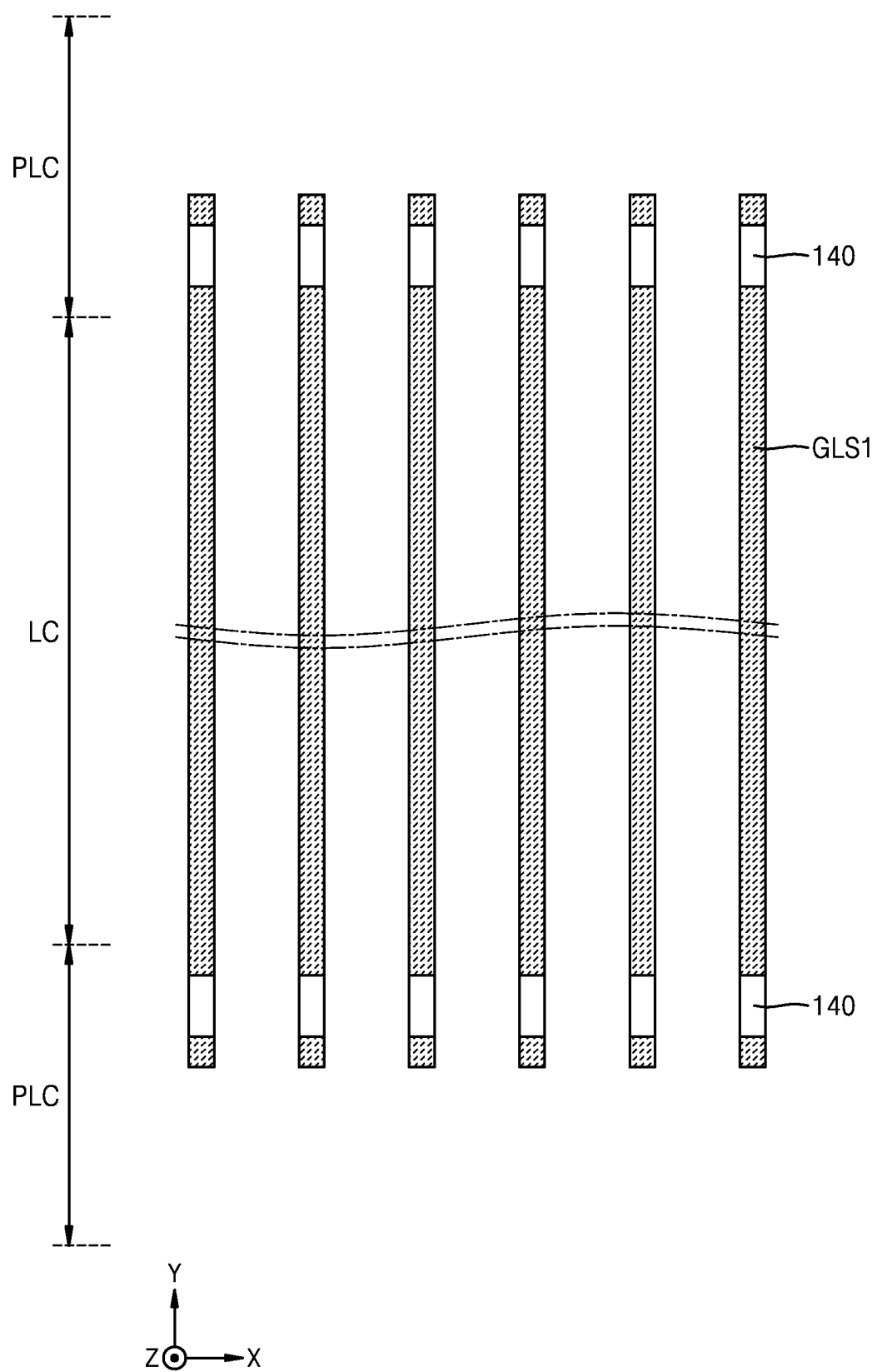
FIGS. 13 to 17 are plan views respectively illustrating various planar shapes of a gate line structure that may be formed by a method of manufacturing an integrated circuit device, according to some embodiments.

In some embodiments, a plurality of gate line structures GLS, as shown in FIGS. 9A, 9B, and 9D, may each include a gate line structure GLS1 including only a line portion that extends lengthwise in the second horizontal direction (e.g., Y direction), as shown in FIG. 13, and gate line structures GLS1, each extending on a straight line in the second horizontal direction (e.g., Y direction), may be apart from each other with the isolation insulating film 140 therebetween. The gate line structure GLS1 and the isolation insulating film 140 may be formed through the processes described with reference to FIGS. 1A to 9D. In some embodiments, in the process described with reference to FIGS. 4A to 4D, the etch mask pattern MPR1, as shown in FIG. 10, may be used instead of the etch mask pattern MPR.

Figure 14:
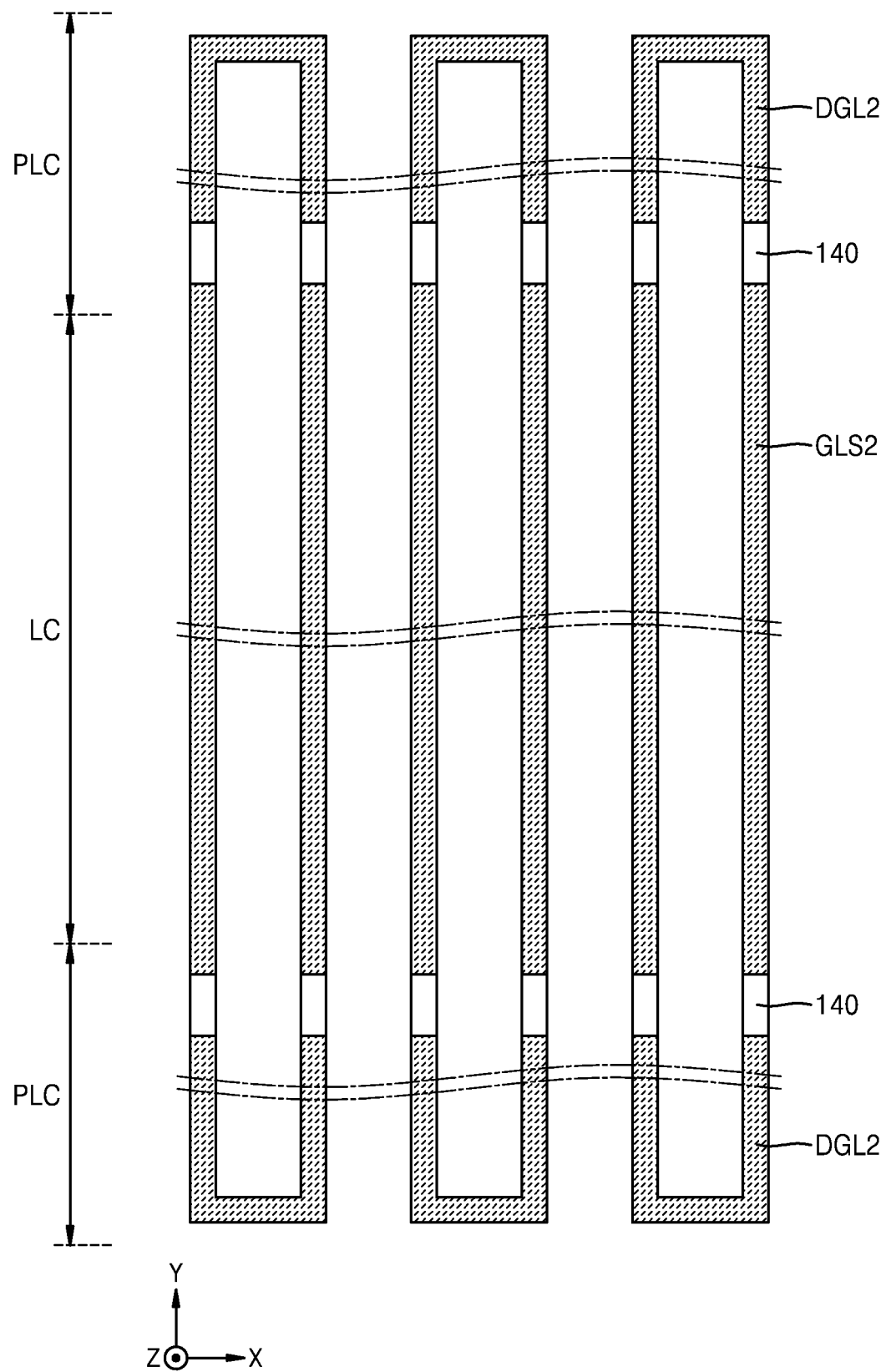

In some embodiments, each of the plurality of gate line structures GLS, as shown in FIGS. 9A, 9B, and 9D, may include a gate line structure GLS2 including a plurality of line portions that extend lengthwise in the second horizontal direction (e.g., Y direction), as shown in FIG. 14. In the cell peripheral area PLC, a plurality of terminal dummy gate portions DGL2, which are respectively on extension lines of the plurality of line portions, may be arranged around the gate line structure GLS2. The gate line structure GLS2 may be apart from the plurality of terminal dummy gate portions DGL2 with the isolation insulating film 140 therebetween. A plurality of gate line structures GLS2, the plurality of terminal dummy gate portions DGL2, and the isolation insulating film 140 may be formed through the processes described with reference to FIGS. 1A to 9D. In some embodiments, in the process described with reference to FIGS. 4A to 4D, the etch mask pattern MPR2, as shown in FIG. 11, may be used instead of the etch mask pattern MPR.

Figure 15:
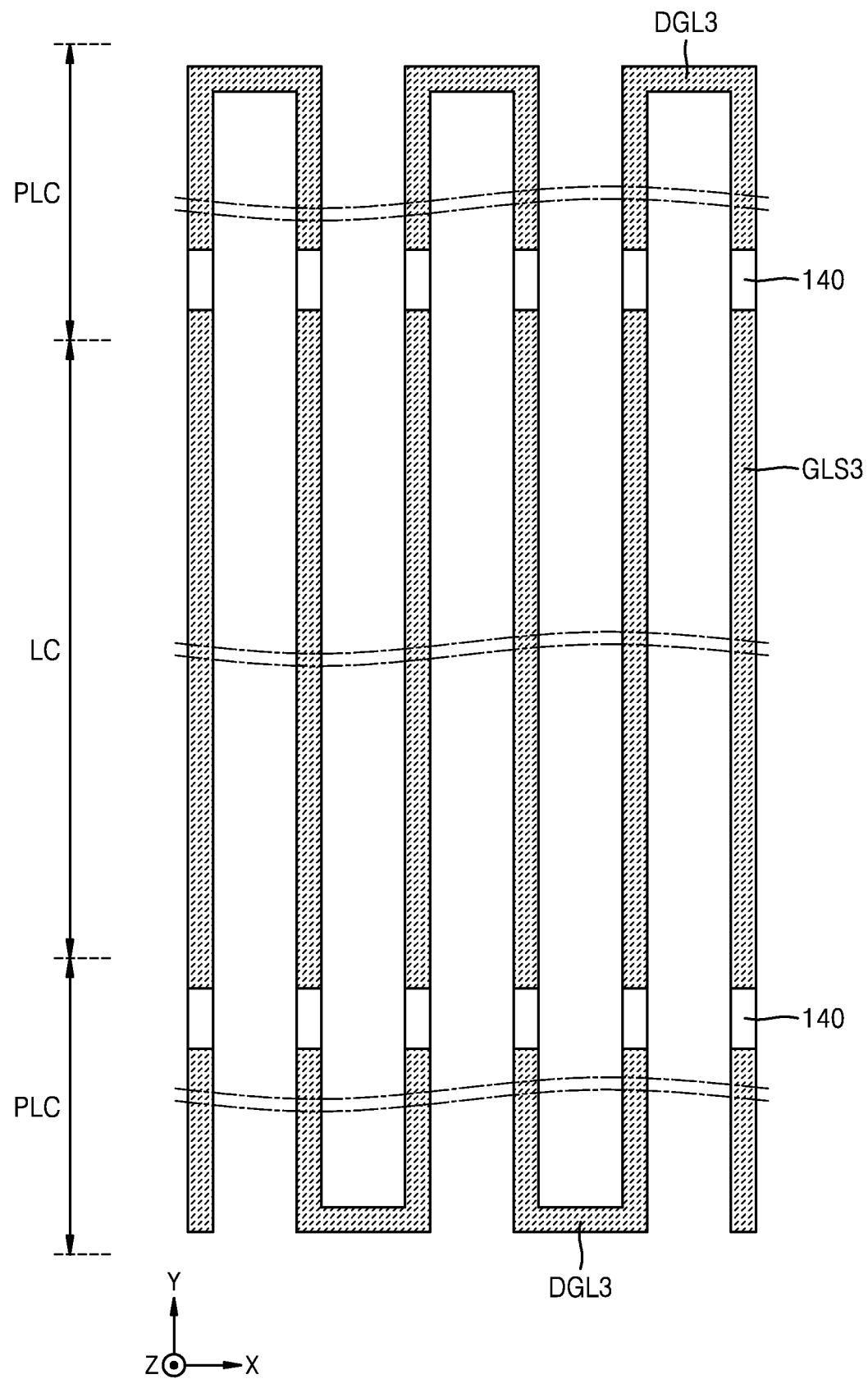

In some embodiments, each of the plurality of gate line structures GLS, as shown in FIGS. 9A, 9B, and 9D, may include a gate line structure GLS3 including a plurality of line portions that extend lengthwise in the second horizontal direction (e.g., Y direction), as shown in FIG. 15. In the cell peripheral area PLC, a plurality of terminal dummy gate portions DGL3, which are respectively on extension lines of the plurality of line portions, may be arranged around the gate line structure GLS3. The gate line structure GLS3 may be apart from the plurality of terminal dummy gate portions DGL3 with the isolation insulating film 140 therebetween. A plurality of gate line structures GLS3, the plurality of terminal dummy gate portions DGL3, and the isolation insulating film 140 may be formed through the processes described with reference to FIGS. 1A to 9D. In some embodiments, in the process described with reference to FIGS. 4A to 4D, the etch mask pattern MPR3, as shown in FIG. 12 may be used instead of the etch mask pattern MPR.

Figure 16:
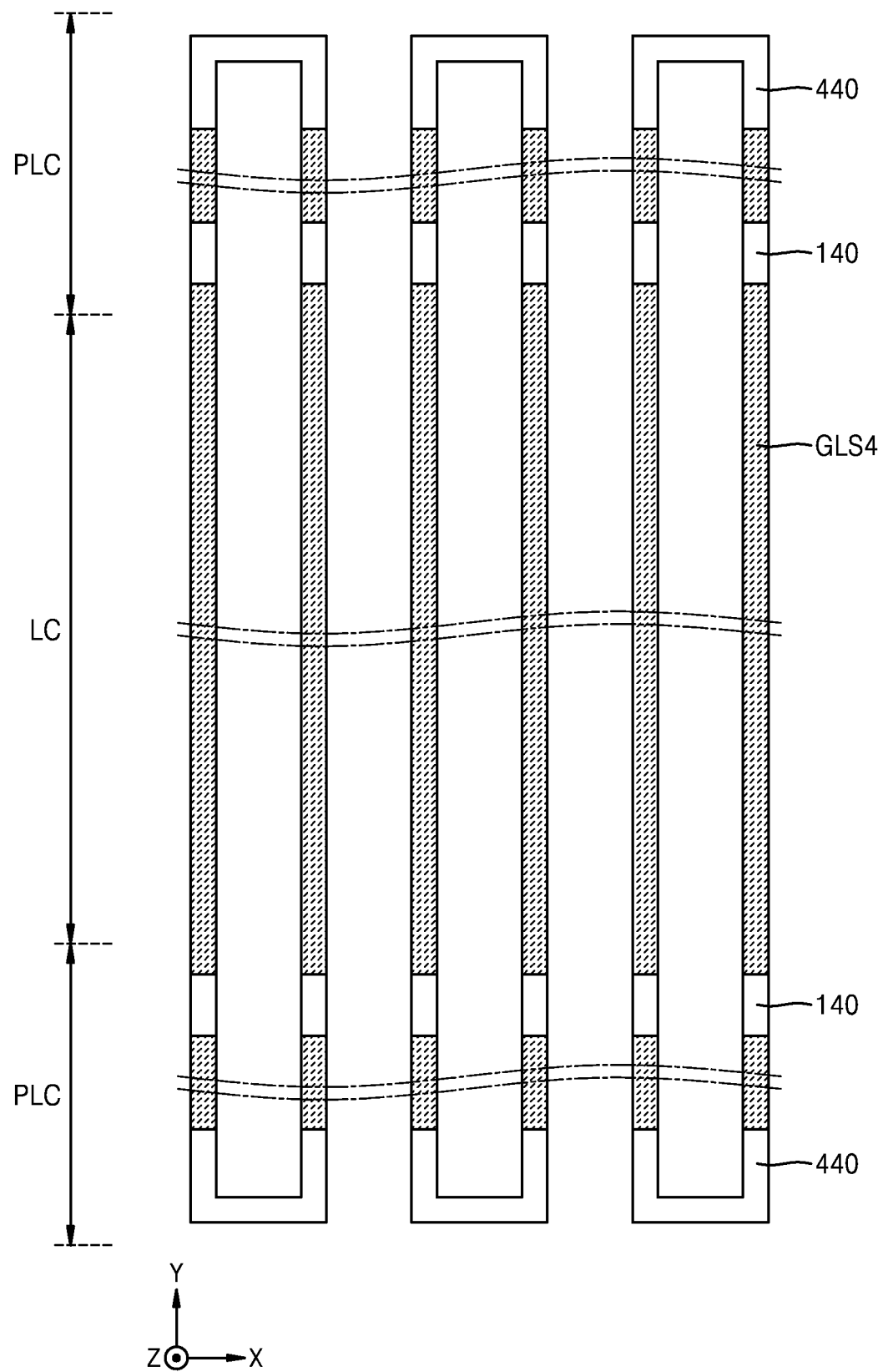

In some embodiments, each of the plurality of gate line structures GLS, as shown in FIGS. 9A, 9B, and 9D, may include a gate line structure GLS4 including a plurality of line portions that extend lengthwise in the second horizontal direction (e.g., Y direction), as shown in FIG. 16. In the cell peripheral area PLC, a peripheral isolation insulating film 440, which is on an extension line of the plurality of line portions, may be arranged around the gate line structure GLS4. A plurality of gate line structures GLS4, the isolation insulating film 140, and the peripheral isolation insulating film 440 may be formed through the processes described with reference to FIGS. 1A to 9D. In some embodiments, in the process described with reference to FIGS. 4A to 4D, the etch mask pattern MPR2, as shown in FIG. 11, may be used instead of the etch mask pattern MPR, and the peripheral isolation insulating film 440 may be formed simultaneously with the isolation insulating film 140.

For example, to form the plurality of gate line structures GLS4, the isolation insulating film 140, and the peripheral isolation insulating film 440, each of the plurality of dummy gate structures DGS may be formed to further include a dummy connection portion connected to ends of two fourth line portions L4 adjacent to each other from among the plurality of fourth line portions L4 such that the two adjacent fourth line portions L4 are connected to each other by the dummy connection portion, similar to the etch mask pattern MPR2, as shown in FIG. 11. In the process described with reference to FIGS. 7A to 7D, to form the plurality of cut spaces GC in the plurality of dummy gate structures DGS, when portions of the plurality of dummy gate structures DGS are removed, the dummy connection portion in the cell peripheral area PLC may also be removed together such that the two fourth line portions L4 are apart from each other.

Alternatively or additionally, in the process described with reference to FIGS. 8A to 8D, when the plurality of isolation insulating films 140 are formed, the plurality of peripheral isolation insulating films 440, as shown in FIG. 16, may be formed together.

Figure 17:
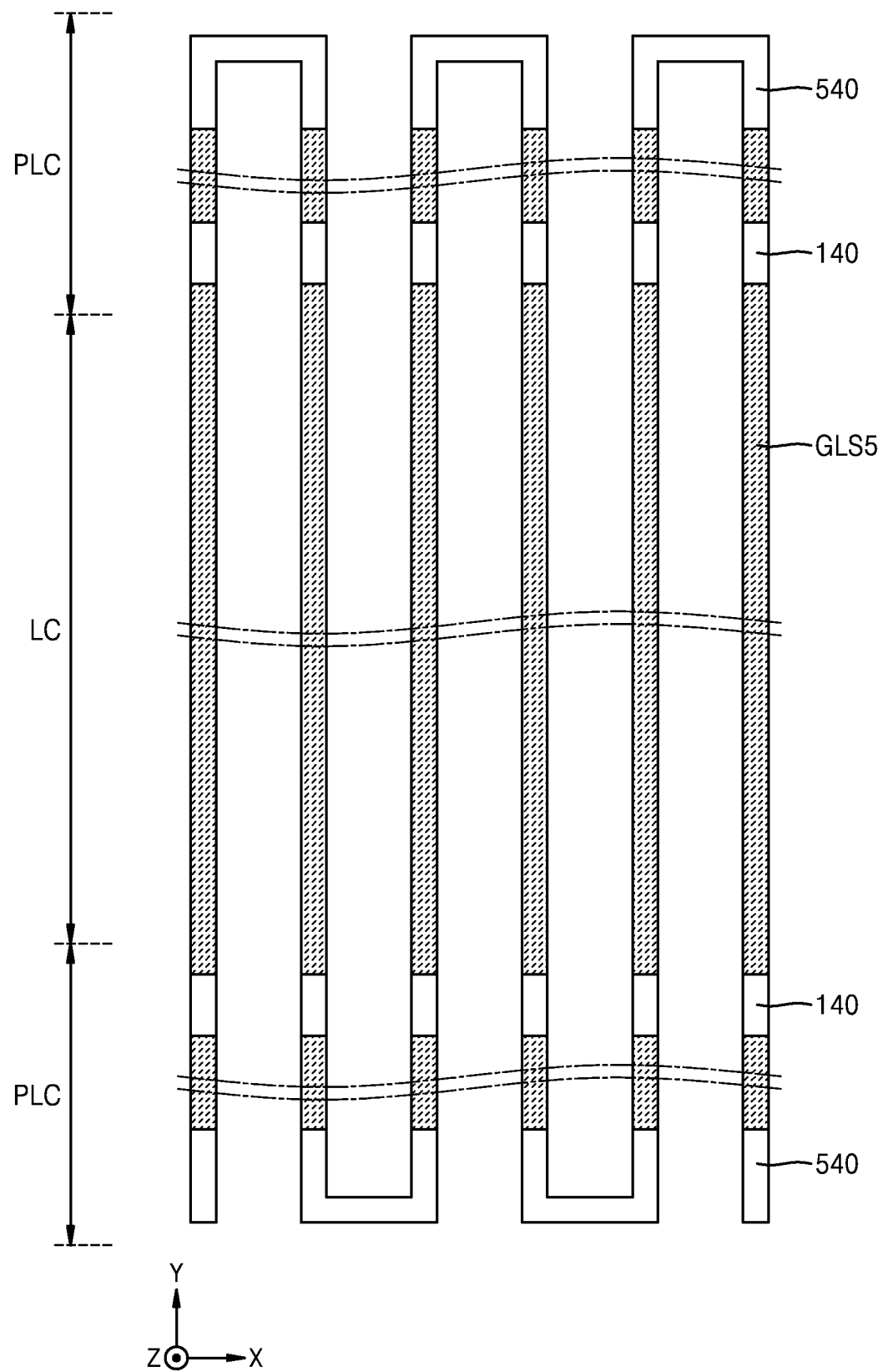

In some embodiments, each of the plurality of gate line structures GLS, as shown in FIGS. 9A, 9B, and 9D, may include a gate line structure GLS5 including a plurality of line portions that extend lengthwise in the second horizontal direction (e.g., Y direction), as shown in FIG. 17. In the cell peripheral area PLC, a peripheral isolation insulating film 540, which is on an extension line of the plurality of line portions, may be arranged around the gate line structure GLS5. A plurality of gate line structures GLS5, the isolation insulating film 140, and the peripheral isolation insulating film 540 may be formed through the processes described with reference to FIGS. 1A to 9D. In some embodiments, in the process described with reference to FIGS. 4A to 4D, the etch mask pattern MPR3, as shown in FIG. 12, may be used instead of the etch mask pattern MPR, and the peripheral isolation insulating film 540 may be formed simultaneously with the isolation insulating film 140.

For example, to form the plurality of gate line structures GLS5, the isolation insulating film 140, and the peripheral isolation insulating film 540, each of the plurality of dummy gate structures DGS may be formed to further include a dummy connection portion connected to ends of two fourth line portions L4 adjacent to each other from among the plurality of fourth line portions L4 such that the two adjacent fourth line portions L4 are connected to each other by the dummy connection portion, similar to the etch mask pattern MPR3, as shown in FIG. 12. In the process described with reference to FIGS. 7A to 7D, to form the plurality of cut spaces GC in the plurality of dummy gate structures DGS, when portions of the plurality of dummy gate structures DGS are removed, the dummy connection portion in the cell peripheral area PLC may also be removed together such that the two fourth line portions L4 are apart from each other. Alternatively or additionally, in the process described with reference to FIGS. 8A to 8D, when the plurality of isolation insulating films 140 are formed, the plurality of peripheral isolation insulating films 540, as shown in FIG. 17, may be formed together.

As described with reference to FIGS. 1A to 9D and 10 to 17, according to the method of manufacturing an integrated circuit device provided by the present disclosure, by stably forming long and narrow line patterns during the process of manufacturing an integrated circuit device having a device region that is reduced in area due to down-scaling, an integrated circuit device having optimized performance and improved reliability may be provided.

While the present disclosure has been particularly shown and described with reference to embodiments thereof, it will be understood that various changes in form and details may be made therein without departing from the spirit and scope of the following claims.

What is claimed is:

1. A method of manufacturing an integrated circuit device, comprising:
    forming a feature structure on a substrate;
    forming a first hardmask configured to cover the feature structure;
    forming, on the first hardmask, a second hardmask comprising a plurality of first line portions, the plurality of first line portions extending lengthwise in a first horizontal direction, each first line portion of the plurality of first line portions being apart from remaining first line portions of the plurality of first line portions in a second horizontal direction, the second horizontal direction being perpendicular to the first horizontal direction;
    forming, on the first hardmask and the second hardmask, an etch mask pattern comprising a plurality of second line portions, the plurality of second line portions extending lengthwise in the second horizontal direction, each second line portion of the plurality of second line portions being apart from remaining second line portions of the plurality of second line portions in the first horizontal direction;
    forming a first hardmask pattern from the first hardmask by etching the first hardmask and using the etch mask pattern as a first etch mask, the first hardmask pattern comprising a plurality of third line portions, each third line portion of the plurality of third line portions being parallel to remaining third line portions of the plurality of third line portions;
    forming a plurality of second hardmask patterns from the second hardmask by etching the second hardmask and using the etch mask pattern as a second etch mask; and
    forming a feature pattern by etching the feature structure and using the plurality of second hardmask patterns and the first hardmask pattern as a feature etch mask, the feature pattern comprising a plurality of fourth line portions, the plurality of fourth line portions extending lengthwise in the second horizontal direction, each fourth line portion of the plurality of fourth line portions being apart from remaining fourth line portions of the plurality of fourth line portions in the first horizontal direction.

2. The method of claim 1, wherein the forming of the second hardmask comprises forming each first line portion of the plurality of first line portions to extend parallel to remaining first line portions of the plurality of first line portions in the first horizontal direction.

3. The method of claim 1, wherein:
    the forming of the feature structure comprises forming the feature structure to comprise a polysilicon film and a dummy insulating capping layer covering the polysilicon film, and
    the forming of the feature pattern comprises forming each of the plurality of fourth line portions of the feature pattern to comprise a first portion of the polysilicon film and a second portion of the dummy insulating capping layer.

4. The method of claim 1, wherein:
    the forming of the first hardmask comprises sequentially stacking a plurality of material layers in a vertical direction,
    each material layer of the plurality of material layers comprises a different material from remaining material layers of the plurality of material layers,
    the forming of the second hardmask comprises forming a layer comprising a distinct material that differs from a constituent material of an uppermost material layer from among the plurality of material layers of the first hardmask, and
    the uppermost material layer of the plurality of material layers of the first hardmask contacts the second hardmask.

5. The method of claim 1, wherein the forming of the etch mask pattern comprises forming the etch mask pattern to cover a sidewall and an upper surface of each of first line portions disposed on the second hardmask.

6. The method of claim 1, further comprising:
after the forming of the feature pattern, forming an insulating structure configured to cover a sidewall of each of the plurality of fourth line portions of the feature pattern, a sidewall of each of the plurality of third line portions of the first hardmask pattern, and a sidewall of each of the plurality of second hardmask patterns, wherein the insulating structure fills each space between the plurality of fourth line portions, and an upper surface of the insulating structure and an upper surface of each of the plurality of second hardmask patterns horizontally extend at a same vertical level;
forming, on the upper surface of each of the insulating structure and the plurality of second hardmask patterns, a third hardmask having an opening;
forming a cut space in the feature pattern by etching the plurality of second hardmask patterns, the first hardmask pattern, and the feature pattern by using the third hardmask as a third etch mask; and
forming an isolation insulating film configured to fill the cut space.

7. The method of claim 1, wherein the etch mask pattern comprises a resist for extreme ultraviolet (EUV) light.

8. The method of claim 1, wherein the forming of the etch mask pattern comprises forming the etch mask pattern to comprise only the plurality of second line portions.

9. The method of claim 1, wherein the forming of the etch mask pattern comprises forming the etch mask pattern to comprise a connection portion extending lengthwise in the first horizontal direction and coupled to an end of each of two second line portions, the two second line portions having been selected from the plurality of second line portions and being adjacent to each other, such that the two second line portions are coupled to each other by the connection portion.

10. The method of claim 1, wherein the forming of the etch mask pattern comprises forming the etch mask pattern to comprise a ring-shaped portion comprising two second line portions having been selected from the plurality of second line portions and being adjacent to each other.

11. A method of manufacturing an integrated circuit device, comprising:
forming a plurality of fin-type active regions in a substrate;
forming a plurality of dummy gate structures on the plurality of fin-type active regions;
forming a cut space in at least one dummy gate structure selected from the plurality of dummy gate structures by partially etching the at least one dummy gate structure; and
forming an isolation insulating film configured to fill the cut space,
wherein the forming of the plurality of dummy gate structures comprises:
forming a feature structure on the substrate in which the plurality of fin-type active regions are formed;
forming a first hardmask configured to cover the feature structure;
forming, on the first hardmask, a second hardmask comprising a plurality of first line portions, the plurality of first line portions extending lengthwise in a first horizontal direction, each first line portion of the plurality of first line portions being apart from remaining first line portions of the plurality of first line portions in a second horizontal direction, the second horizontal direction being perpendicular to the first horizontal direction;
forming, on the first hardmask and the second hardmask, an etch mask pattern comprising a plurality of second line portions, the plurality of second line portions extending lengthwise in the second horizontal direction, each second line portion of the plurality of second line portions being apart from remaining second line portions of the plurality of second line portions in the first horizontal direction;
forming a first hardmask pattern from the first hardmask by etching the first hardmask and using the etch mask pattern as a first etch mask, the first hardmask pattern comprising a plurality of third line portions, each third line portion of the plurality of third line portions being parallel to remaining third line portions of the plurality of third line portions; and
forming a plurality of second hardmask patterns from the second hardmask by etching the second hardmask and using the etch mask pattern as a second etch mask; and
wherein the forming of the plurality of dummy gate structures comprises forming the plurality of dummy gate structures to respectively comprise a plurality of fourth line portions by etching the feature structure by using the plurality of second hardmask patterns and the first hardmask pattern as a feature etch mask, the plurality of fourth line portions extending lengthwise in the second horizontal direction, and each fourth line portion of the plurality of fourth line portions being apart from remaining fourth line portions of the plurality of fourth line portions in the first horizontal direction.

12. The method of claim 11, wherein each of the plurality of dummy gate structures comprises a polysilicon film and a dummy insulating capping layer covering the polysilicon film.

13. The method of claim 11, wherein the forming of the etch mask pattern comprises forming the etch mask pattern to comprise a plurality of uneven portions at a lower surface thereof facing the substrate.

14. The method of claim 11, further comprising:
after the forming of the plurality of dummy gate structures, and before the forming of the cut space in the at least one dummy gate structure, forming an insulating structure configured to fill each space between the plurality of dummy gate structures; and
forming, on an upper surface of each of the insulating structure and the plurality of second hardmask patterns, a third hardmask having an opening,
wherein the forming of the cut space in the at least one dummy gate structure comprises selectively etching only the at least one dummy gate structure from among the at least one dummy gate structure and the insulating structure by using the third hardmask as a third etch mask.

15. The method of claim 11, wherein:
the etch mask pattern comprises:
a bottom anti-reflective coating, which contacts the first hardmask and the second hardmask, and
a photoresist pattern disposed on the bottom anti-reflective coating configured to cover the first hardmask and the second hardmask, and
the photoresist pattern comprises a resist for extreme ultraviolet (EUV) light.

16. The method of claim 11, wherein the forming of the etch mask pattern comprises forming the etch mask pattern to comprise only the plurality of second line portions.

17. The method of claim 11, wherein:
the forming of the etch mask pattern comprises coupling two second line portions selected from the plurality of second line portions, the two second line portions being adjacent to each other; and
the forming of the plurality of dummy gate structures comprises forming each of the plurality of dummy gate structures to comprise a dummy connection portion coupled to ends of two fourth line portions adjacent to each other from among the plurality of fourth line portions such that the two fourth line portions are coupled to each other by the dummy connection portion.

18. The method of claim 17, wherein the forming of the cut space in the at least one dummy gate structure comprises removing the dummy connection portion such that the two fourth line portions are separated from each other.

19. A method of manufacturing an integrated circuit device, comprising:
forming a plurality of fin-type active regions in a substrate to extend lengthwise in a first horizontal direction;
forming a plurality of dummy gate structures on the plurality of fin-type active regions to extend lengthwise in a second horizontal direction, the second horizontal direction being perpendicular to the first horizontal direction;
filling each space between the plurality of dummy gate structures with an insulating structure;
forming, on the plurality of dummy gate structures and a plurality of insulating structures, a hardmask pattern having an opening that exposes at least one dummy gate structure selected from the plurality of dummy gate structures and a portion of the plurality of insulating structures;
forming a cut space in the at least one dummy gate structure by selectively etching the at least one dummy gate structure from among the at least one dummy gate structure and the insulating structure; and
forming an isolation insulating film configured to fill the cut space,
wherein the forming of the plurality of dummy gate structures comprises:
forming a feature structure on the substrate in which the plurality of fin-type active regions are formed;
forming a first hardmask configured to cover the feature structure;
forming, on the first hardmask, a second hardmask comprising a plurality of first line portions, the plurality of first line portions extending lengthwise in the first horizontal direction;
forming, on the first hardmask and the second hardmask, an etch mask pattern comprising a plurality of second line portions, the plurality of second line portions extending lengthwise in the second horizontal direction;
forming a first hardmask pattern comprising a line pattern from the first hardmask by etching the first hardmask and using the etch mask pattern as a first etch mask;
forming a plurality of second hardmask patterns, respectively comprising a plurality of island patterns from the second hardmask, by etching the second hardmask and using the etch mask pattern as a second etch mask; and
etching the feature structure by using the plurality of second hardmask patterns and the first hardmask pattern as a feature etch mask.

20. The method of claim 19, wherein the forming of the etch mask pattern comprises forming the etch mask pattern such that two adjacent second line portions selected from the plurality of second line portions are coupled to each other.

* * * * *